(12) United States Patent
Kobayashi

(10) Patent No.: US 9,312,280 B2
(45) Date of Patent: Apr. 12, 2016

(54) SEMICONDUCTOR DEVICE

(71) Applicant: Semiconductor Energy Laboratory Co., Ltd., Atsugi-shi, Kanagawa-ken (JP)

(72) Inventor: Hidetomo Kobayashi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/801,347

(22) Filed: Jul. 16, 2015

(65) Prior Publication Data

US 2016/0027809 A1    Jan. 28, 2016

(30) Foreign Application Priority Data

Jul. 25, 2014  (JP) .................................. 2014-151823

(51) Int. Cl.
  *H01L 27/12*   (2006.01)
  *H01L 29/24*   (2006.01)
  *H01L 29/786*  (2006.01)
  *H01L 27/108*  (2006.01)
  *H01L 27/115*  (2006.01)

(52) U.S. Cl.
  CPC ...... *H01L 27/1225* (2013.01); *H01L 27/10805* (2013.01); *H01L 27/115* (2013.01); *H01L 27/124* (2013.01); *H01L 27/1251* (2013.01); *H01L 27/1255* (2013.01); *H01L 29/24* (2013.01); *H01L 29/7869* (2013.01); *H01L 29/78648* (2013.01)

(58) Field of Classification Search
  CPC .................. H01L 27/11807; H01L 27/10802; H01L 27/10897
  USPC ............................................ 257/43, 202, 203
  See application file for complete search history.

(56) References Cited

U.S. PATENT DOCUMENTS 5,489,870 A   2/1996  Arakawa
5,731,856 A   3/1998  Kim et al.
(Continued)

FOREIGN PATENT DOCUMENTS

EP   1737044 A   12/2006
EP   2226847 A   9/2010
(Continued)

OTHER PUBLICATIONS

Kobayashi.H et al., "Processor with 4.9-μs break-even time in power gating using crystalline In—Ga—Zn—oxide transistor", Cool Chips XVI, Apr. 17, 2013, pp. 1-3.
(Continued)

*Primary Examiner* — Cuong Q Nguyen
(74) *Attorney, Agent, or Firm* — Fish & Richardson P.C.

(57) ABSTRACT

A semiconductor device capable of retaining data for a long time is provided. The semiconductor device includes first to third transistors, a fourth transistor including first and second gates, first to third nodes, a capacitor, and an input terminal. A source of the first transistor is connected to the input terminal. A drain of the first transistor and a source of the second transistor are connected to the first node. A gate of the second transistor, a drain of the second transistor, and a source of the third transistor are connected to the second node. A gate of the third transistor, a drain of the third transistor, the capacitor, and the second gate of the fourth transistor are connected to the third node.

17 Claims, 19 Drawing Sheets

(56) References Cited

U.S. PATENT DOCUMENTS

| | | |
|---|---|---|
| 5,744,864 A | 4/1998 | Cillessen et al. |
| 5,815,446 A | 9/1998 | Tobita |
| 5,821,805 A | 10/1998 | Jinbo |
| 5,892,267 A | 4/1999 | Takada |
| 6,069,518 A | 5/2000 | Nakai |
| 6,163,487 A | 12/2000 | Ghilardelli |
| 6,172,886 B1 | 1/2001 | Lauterbach et al. |
| 6,175,264 B1 | 1/2001 | Jinbo |
| 6,294,274 B1 | 9/2001 | Kawazoe et al. |
| 6,373,325 B1 | 4/2002 | Kuriyama |
| 6,563,174 B2 | 5/2003 | Kawasaki et al. |
| 6,603,346 B2 | 8/2003 | Sawada et al. |
| 6,664,846 B1 | 12/2003 | Maung et al. |
| 6,720,822 B2 | 4/2004 | Torrisi et al. |
| 6,727,522 B1 | 4/2004 | Kawasaki et al. |
| 6,747,897 B2 | 6/2004 | Karaki |
| 6,791,882 B2 | 9/2004 | Seki et al. |
| 6,847,250 B2 | 1/2005 | Kim |
| 6,914,791 B1 | 7/2005 | Park et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwassaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,602,231 B2 | 10/2009 | Yamamoto et al. |
| 7,674,650 B2 | 3/2010 | Akimoto et al. |
| 7,732,819 B2 | 6/2010 | Akimoto et al. |
| 7,777,557 B2 | 8/2010 | Yamahira |
| 8,004,907 B2 | 8/2011 | Russell et al. |
| 8,107,279 B2 | 1/2012 | Yamaoka et al. |
| 8,209,504 B2 | 6/2012 | Nakanishi et al. |
| 8,222,953 B2 | 7/2012 | Nakamura |
| 8,598,945 B2 | 12/2013 | Gorisse |
| 8,773,906 B2 | 7/2014 | Ohmaru |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0184360 A1 | 10/2003 | Wang et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0102120 A1 | 4/2009 | Hou et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0089927 A1 | 4/2011 | Yamazaki et al. |
| 2011/0101942 A1 | 5/2011 | Yamazaki et al. |
| 2011/0216566 A1 | 9/2011 | Kawata |
| 2012/0051118 A1 | 3/2012 | Yamazaki et al. |
| 2012/0161139 A1 | 6/2012 | Endo et al. |
| 2012/0193620 A1 | 8/2012 | Godo et al. |
| 2012/0195138 A1 | 8/2012 | Son |
| 2013/0148411 A1 | 6/2013 | Atsumi et al. |
| 2013/0300462 A1 | 11/2013 | Koyama et al. |
| 2013/0307496 A1 | 11/2013 | Watanabe |
| 2013/0314152 A1 | 11/2013 | Matsuzaki et al. |
| 2014/0068301 A1 | 3/2014 | Watanabe |
| 2014/0077786 A1 | 3/2014 | Shionoiri et al. |
| 2014/0339541 A1* | 11/2014 | Kato ................. H01L 27/11563 257/43 |
| 2015/0054571 A1 | 2/2015 | Watanabe et al. |
| 2015/0187775 A1* | 7/2015 | Yamamoto ........ H01L 27/10897 365/203 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2000-270541 A | 9/2000 |

(56) References Cited

FOREIGN PATENT DOCUMENTS

| JP | 2002-076356 A | 3/2002 |
|---|---|---|
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-171700 A | 9/2011 |
| JP | 2012-069932 A | 4/2012 |
| JP | 2012-146965 A | 8/2012 |
| JP | 2013-168631 A | 8/2013 |
| WO | WO-2004/114391 | 12/2004 |

OTHER PUBLICATIONS

Nagatsuka.S et al., "A 3bit/cell Nonvolatile Memory with Crystalline In—Ga—Zn—O TFT", IMW 2013 (5th IEEE International Memory Workshop), pp. 188-191.

Kato.K et al., "Evaluation of Off-State Current Characteristics of Transistor Using Oxide Semiconductor Material Indium.Gallium. Zinc Oxide", Jpn. J. Appl. Phys. (Japanese Journal of Applied Physics), 2012, vol. 51, pp. 021201-1-021201-7.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1: Polarizer-Free Reflective LCD Combined With Ultra Low-Power Driving Technology", SID Digest '09 : SID International Symposium Digest of Technical Papers, May 31, 209, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:AL and SN-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The Blue Phase", Physics Letters, Sep. 10, 1973, vol.45A, No. 2, pp. 115-116.

Costello.M et al., "Electron Microscopy of a Cholesteric Liquid Crystal and its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp.165-169.

Hosono.H, "68.3:Invited Paper:Transparent Amorphous Oxide Semiconductors for High Peformance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects In ZnO", Phys. Rev. B (Physical Review. B), Oct. 4, 2007, vol. 76, No. 16, pp. 165202-1-165202-22.

Janotti.A et al., "Oxygen Vacancies In ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a charge-generation layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites For Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YbFe2O4, and Yb2Fe3O7 Types of Structures for Compounds in the In2O3 and ScO3—A2O3—BO Systems [A; fe, Ga, Or Al; B: Mg, Mn, Fe, Ni, Cu, Or Zn]at Temperatures over 1000° C.", Journal of Solid Chemistry, 1985, vol. 60, pp. 382-384.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7,8,9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

(56) References Cited

OTHER PUBLICATIONS

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev.Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., The phase relations in the In2O3—Ga2ZnO4—ZnO system at 1350° C, Journal of Solid State Chemistry, Aug. 1, 1991, vol. 93, No. 2, pp. 298-315.

Nakamura.M "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs with a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09 : Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. Amoled Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papaers,May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003 vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

US 9,196,626, 11/2015, Kato (withdrawn)*

* cited by examiner

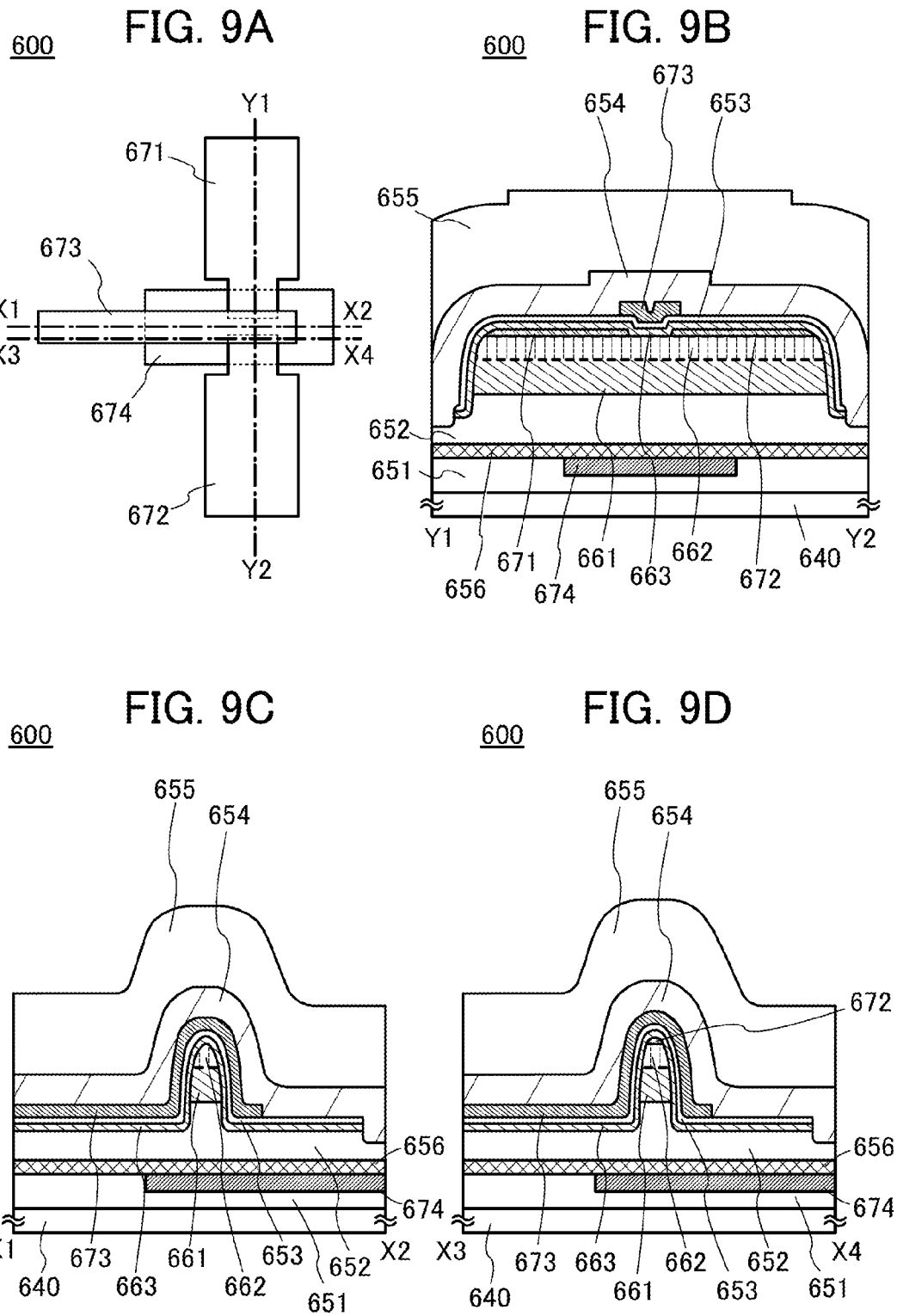

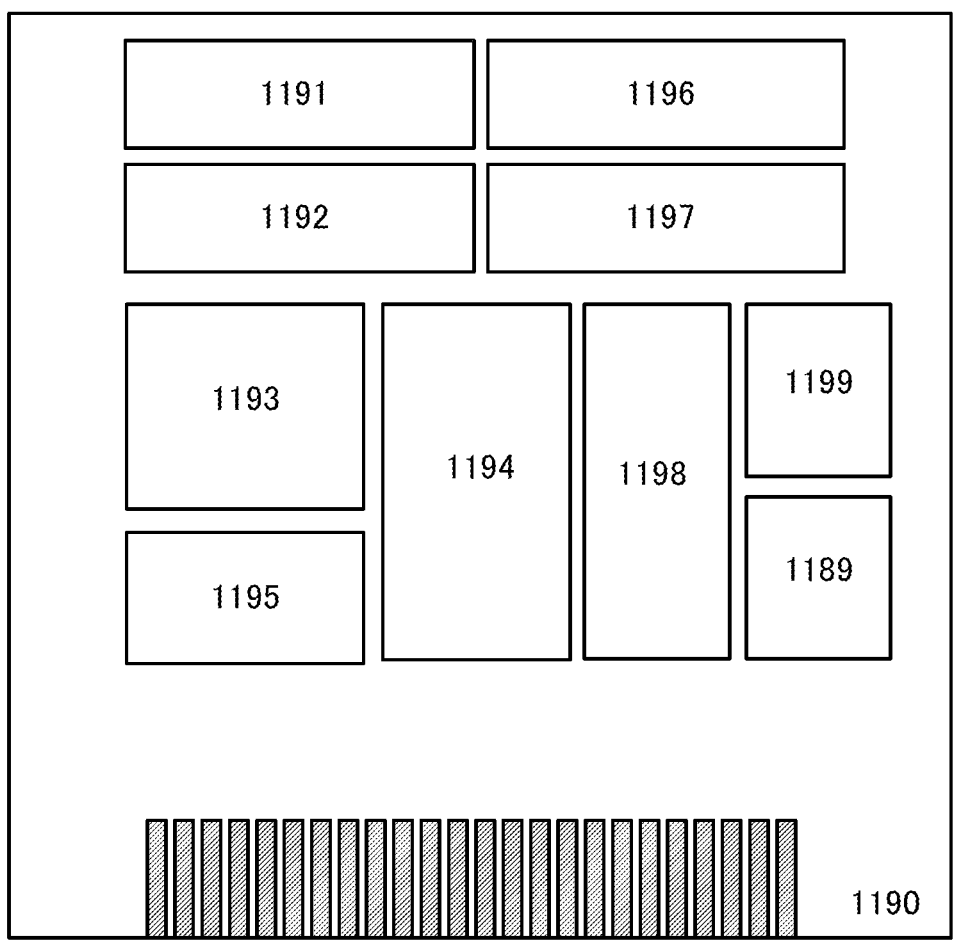

SEMICONDUCTOR DEVICE

BACKGROUND OF THE INVENTION

1. Field of the Invention

The present invention relates to an object, a method, or a manufacturing method. In addition, the present invention relates to a process, a machine, manufacture, or a composition of matter. One embodiment of the present invention relates to a semiconductor device, a display device, a light-emitting device, a power storage device, a storage device, a driving method thereof, or a manufacturing method thereof. In particular, one embodiment of the present invention relates to a semiconductor device, a display device, or a light-emitting device each including an oxide semiconductor.

In this specification and the like, a semiconductor device generally means a device that can function by utilizing semiconductor characteristics. A display device, an electro-optical device, a semiconductor circuit, and an electronic device include a semiconductor device in some cases.

2. Description of the Related Art

A technique in which a transistor is formed using a semiconductor material has attracted attention. The transistor is used in a wide range of electronic devices such as an integrated circuit (IC) or an image display device (also simply referred to as a display device). A silicon-based semiconductor material is widely known as a semiconductor material applicable to the transistor. As another material, an oxide semiconductor has attracted attention.

Patent Document 1 discloses an example in which a transistor including an oxide semiconductor in a channel formation region (hereinafter referred to as an oxide semiconductor transistor) is used in a dynamic random access memory (DRAM). The oxide semiconductor transistor has extremely low leakage current in an off state (off-state current); thus, a low-power DRAM having a low refresh frequency can be formed.

Patent Document 2 discloses a nonvolatile memory including an oxide semiconductor transistor. Unlike the flash memory, the nonvolatile memory has unlimited cycling capability, can easily operate at high speed, and consumes less power.

Patent Document 2 discloses an example in which an oxide semiconductor transistor has a second gate to control the threshold voltage of the transistor so that the off-state current of the transistor is lowered.

Patent Documents 2 and 3 each disclose a structure example of a circuit for driving the second gate.

REFERENCE

Patent Document 1: Japanese Published Patent Application No. 2013-168631

Patent Document 2: Japanese Published Patent Application No. 2012-069932

Patent Document 3: Japanese Published Patent Application No. 2012-146965

SUMMARY OF THE INVENTION

It is an object of one embodiment of the present invention to provide a storage device capable of retaining data for a long time. It is an object of one embodiment of the present invention to provide a low-power storage device. It is an object of one embodiment of the present invention to provide a semiconductor device capable of retaining data for a long time. It is an object of one embodiment of the present invention to provide a low-power semiconductor device. It is an object of one embodiment of the present invention to provide a novel semiconductor device.

Note that the description of a plurality of objects does not disturb the existence of each object. One embodiment of the present invention does not necessarily achieve all the objects described above. Other objects will be apparent from and can be derived from the description of the specification, the drawings, the claims, and the like, and such objects could be objects of one embodiment of the present invention.

One embodiment of the present invention is a semiconductor device that includes first to third transistors, first to third nodes, a fourth transistor including first and second gates, a capacitor, and an input terminal. A gate of the first transistor is electrically connected to the third node. One of a source and a drain of the first transistor is electrically connected to the input terminal. The other of the source and the drain of the first transistor is electrically connected to the first node. A gate of the second transistor is electrically connected to the second node. One of a source and a drain of the second transistor is electrically connected to the first node. The other of the source and the drain of the second transistor is electrically connected to the second node. A gate of the third transistor is electrically connected to the third node. One of a source and a drain of the third transistor is electrically connected to the second node. The other of the source and the drain of the third transistor is electrically connected to the third node. A first terminal of the capacitor is electrically connected to the third node. The second gate is electrically connected to the third node. The first and second gates overlap with each other with a semiconductor layer therebetween.

One embodiment of the present invention is a semiconductor device that includes a first transistor including first and second gates, a second transistor including third and fourth gates, a third transistor including fifth and sixth gates, first to third nodes, a fourth transistor including seventh and eighth gates, a capacitor, and an input terminal. The first gate is electrically connected to the third node. The second gate is electrically connected to the third node. One of a source and a drain of the first transistor is electrically connected to the input terminal. The other of the source and the drain of the first transistor is electrically connected to the first node. The third gate is electrically connected to the second node. The fourth gate is electrically connected to the third node. One of a source and a drain of the second transistor is electrically connected to the first node. The other of the source and the drain of the second transistor is electrically connected to the second node. The fifth gate is electrically connected to the third node. The sixth gate is electrically connected to the third node. One of a source and a drain of the third transistor is electrically connected to the second node. The other of the source and the drain of the third transistor is electrically connected to the third node. A first terminal of the capacitor is electrically connected to the third node. The eighth gate is electrically connected to the third node. The seventh and eighth gates overlap with each other with a semiconductor layer therebetween.

In any of the above embodiments, each of the first to third transistors is preferably an n-channel transistor.

In any of the above embodiments, each of the first to third transistors preferably includes an oxide semiconductor in a channel.

In any of the above embodiments, the oxide semiconductor preferably contains indium, zinc, and M (M is Al, Ti, Ga, Y, Zr, La, Ce, Nd, or Hf).

One embodiment of the present invention is a storage device that includes the semiconductor device in any of the above embodiments and a storage element.

One embodiment of the present invention is a register circuit that includes the semiconductor device in any of the above embodiments.

One embodiment of the present invention is a display device that includes the semiconductor device in any of the above embodiments and a display element.

One embodiment of the present invention is an electronic device that includes the semiconductor device in any of the above embodiments and at least one of a microphone, a speaker, a display portion, and an operation key.

In this specification and the like, ordinal numbers such as "first" and "second" are used to avoid confusion among components, and thus do not limit the number of the components.

Note that a "semiconductor" includes characteristics of an "insulator" in some cases when conductivity is sufficiently low, for example. Furthermore, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

A transistor is a kind of semiconductor elements and can achieve amplification of current or voltage, switching operation for controlling conduction or non-conduction, or the like. A transistor in this specification includes an insulated-gate field effect transistor (IGFET) and a thin film transistor (TFT).

Note that functions of a "source" and a "drain" of a transistor are sometimes interchanged with each other when a transistor of an opposite conductivity type is used or when the direction of current flow is changed in circuit operation, for example. Therefore, the terms "source" and "drain" can be interchanged with each other in this specification.

Note that the terms "film" and "layer" can be interchanged with each other according to circumstances. For example, the term "conductive layer" can be changed into the term "conductive film" in some cases. In addition, the term "insulating film" can be changed into the term "insulating layer" in some cases.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relation relationship shown in drawings or texts, another connection relationship is included in the drawings or the texts.

Here, each of X and Y denotes an object (e.g., a device, an element, a circuit, a wiring, an electrode, a terminal, a conductive film, or a layer).

Examples of the case where X and Y are directly connected include the case where an element that enables electrical connection between X and Y (e.g., a switch, a transistor, a capacitor, an inductor, a resistor, a diode, a display element, a light-emitting element, or a load) is not connected between X and Y, and the case where X and Y are connected without the element that enables electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a storage circuit; or a control circuit) can be connected between X and Y. Note that for example, in the case where a signal output from X is transmitted to Y even when another circuit is provided between X and Y, X and Y are functionally connected. The case where X and Y are functionally connected includes the case where X and Y are directly connected and X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another element or another circuit provided therebetween), and X and Y are directly connected (i.e., the case where X and Y are connected without another element or another circuit provided therebetween). That is, in this specification and the like, the explicit description "X and Y are electrically connected" is the same as the explicit description "X and Y are connected".

For example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to part of Z1 and another part of Z1 is directly connected to X while a drain (or a second terminal or the like) of the transistor is directly connected to part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in that order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in that order," and "X is electrically connected to Y through a source (or a first terminal or the like) and a drain (or a second terminal or the like) of a transistor, and X the source (or the first terminal or the like) of the transistor, the drain (or the second terminal or the like) of the transistor, and Y are connected in that order." When the connection order in a circuit structure is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film functions as the wiring and the electrode. Thus, the term "electrical connection" in this specification also means such a case where one conductive film has functions of a plurality of components.

One embodiment of the present invention can provide a storage device capable of retaining data for a long time. One embodiment of the present invention can provide a low-power storage device. One embodiment of the present invention can provide a semiconductor device capable of retaining data for a long time. One embodiment of the present invention can provide a low-power semiconductor device. One embodiment of the present invention can provide a novel semiconductor device.

Note that the description of these effects does not disturb the existence of other effects. In one embodiment of the present invention, there is no need to obtain all the effects described above. Other effects will be apparent from and can be derived from the description of the specification, the drawings, the claims, and the like.

BRIEF DESCRIPTION OF THE DRAWINGS

In the accompanying drawings:

FIGS. 9A to 9D are a top view and cross-sectional views illustrating a transistor example;

FIG. 16 is a block diagram illustrating a CPU structure example;

DETAILED DESCRIPTION OF THE INVENTION

Figure 1:
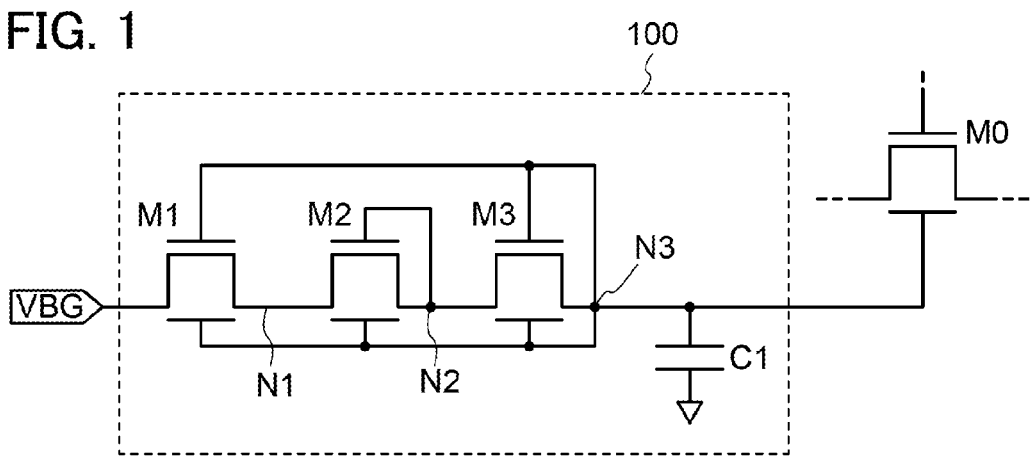
FIG. 1 is a circuit diagram illustrating an example of a driver circuit.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments.

Note that in the structures of the invention described below, the same portions or portions having similar functions are denoted by the same reference numerals in different drawings, and description of such portions is not repeated. In some cases, the same hatching pattern is used for portions having similar functions, and the portions are not denoted by reference numerals.

Note that in each drawing described in this specification, the size, the layer thickness, or the region of each component is exaggerated for clarity in some cases. Therefore, embodiments of the present invention are not limited to such scales.

Embodiment 1

In this embodiment, the circuit structure of a semiconductor device in one embodiment of the present invention is described.

FIG. 1 illustrates the circuit structure of a semiconductor device for driving a second gate of a transistor. The semiconductor device in FIG. 1 includes an input terminal VBG, a transistor M0 including first and second gates, and a circuit 100 electrically connected to the second gate of the transistor M0.

The circuit 100 includes a transistor M1, a transistor M2, a transistor M3, a node N1, a node N2, a node N3, and a capacitor C1.

The second gate of the transistor M0 has a function of controlling the threshold voltage $V_{th}$ of the transistor M0. For example, in the case where the transistor M0 is an n-channel transistor, $V_{th}$ of the transistor M0 can be shifted in a positive direction and off-state current at $V_{gs}$=0 V can be reduced (i.e., the transistor M0 can be normally-off) by application of a potential lower than a source potential to the second gate of the transistor M0. In contrast, $V_{th}$ of the transistor M0 can be shifted in a negative direction and on-state current can flow at $V_{gs}$=0 V (i.e., the transistor M0 can be normally-on) by application of a potential higher than the source potential to the second gate of the transistor M0.

The first and second gates of the transistor M0 overlap with each other with a semiconductor layer therebetween.

A first gate of the transistor M1 is electrically connected to the node N3. A second gate of the transistor M1 is electrically connected to the node N3. One of a source and a drain of the transistor M1 is electrically connected to the input terminal VBG. The other of the source and the drain of the transistor M1 is electrically connected to the node N1.

A first gate of the transistor M2 is electrically connected to the node N2. A second gate of the transistor M2 is electrically connected to the node N3. One of a source and a drain of the transistor M2 is electrically connected to the node N1. The other of the source and the drain of the transistor M2 is electrically connected to the node N2.

A first gate of the transistor M3 is electrically connected to the node N3. A second gate of the transistor M3 is electrically connected to the node N3. One of a source and a drain of the transistor M3 is electrically connected to the node N2. The other of the source and the drain of the transistor M3 is electrically connected to the node N3.

A first terminal of the capacitor C1 is electrically connected to the node N3, and a constant low potential is applied to a second terminal of the capacitor C1. A ground potential may be applied as the low potential.

The second gate of the transistor M0 is electrically connected to the node N3.

The transistors M1 to M3 preferably have low off-state current. For example, the off-state current of the transistors M1 to M3 is preferably lower than or equal to $10^{-18}$ A/μm, more preferably lower than or equal to $10^{-21}$ A/μm, still more preferably lower than or equal to $10^{-24}$ A/μm. An oxide semiconductor transistor can be used as a transistor having low off-state current.

Unless otherwise specified, off-state current in this specification refers to drain current of a transistor in an off state (also referred to as a non-conductive state or a cutoff state). Unless otherwise specified, the off state of an n-channel transistor means that voltage $V_{gs}$ between its gate and source is lower than $V_{th}$, and the off state of a p-channel transistor means that $V_{gs}$ is higher than $V_{th}$. For example, the off-state current of an n-channel transistor sometimes refers to drain current that flows when $V_{gs}$ is lower than $V_{th}$. The off-state current of a transistor depends on $V_{gs}$ in some cases. Thus, "the off-state current of a transistor is lower than or equal to $10^{-21}$ A" means "there is $V_{gs}$ with which the off-state current of a transistor becomes lower than or equal to $10^{-21}$ A" in some cases. Furthermore, "the off-state current of a transistor" means "off-state current in an off state at predetermined $V_{gs}$", "off-state current in an off state at $V_{gs}$ in a predetermined range", "off-state current in an off state at $V_{gs}$ with which sufficiently reduced off-state current is obtained", or the like in some cases.

In this specification, the off-state current of a transistor with channel width W is sometimes represented by a current value per channel width or by a current value per given channel width (e.g., 1 μm). In the latter case, the unit of off-state current is sometimes represented by current per length (e.g., A/μm).

The off-state current of a transistor depends on temperature in some cases. Unless otherwise specified, the off-state current in this specification might be off-state current at room temperature, 60° C., 85° C., 95° C., or 125° C. Alternatively, the off-state current might be off-state current at temperature at which the reliability of a semiconductor device or the like including the transistor is ensured or temperature at which the semiconductor device or the like is used (e.g., temperature in the range of 5 to 35° C.).

The off-state current of a transistor depends on voltage Vas between its drain and source in some cases. Unless otherwise specified, the off-state current in this specification might be off-state current at Vas with an absolute value of 0.1 V, 0.8 V, 1 V, 1.2 V, 1.8 V, 2.5 V, 3 V, 3.3 V, 10 V, 12 V, 16 V, or 20 V. Alternatively, the off-state current might be off-state current at Vas at which the reliability of a semiconductor device or the like including the transistor is ensured or Vas used in the semiconductor device or the like including the transistor.

Next, the operation of the circuit 100 in FIG. 1 is described with reference to FIGS. 2A and 2B. Note that in the following description, the transistors M0 to M3 are n-channel transistors.

Figure 2A:
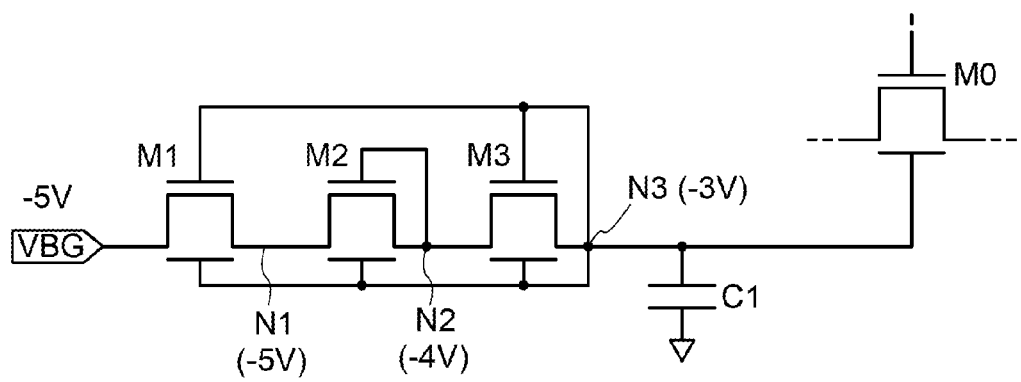
FIGS. 2A and 2B are circuit diagrams each illustrating an operation example of the driver circuit.

FIG. 2A is an example in which −3 V is applied to the second gate of the transistor M0. On the assumption that $V_{th}$ of the transistors M1 to M3 is 1 V, in FIG. 2A, when −5 V is applied to the input terminal VBG, the potential of the node N1 is −5 V, the potential of the node N2 is −4 V, and the potential of the node N3 (the potential of the second gate of the transistor M0) is −3 V. In other words, when −5 V is applied to the input terminal VBG, −3 V can be applied to the second gate of the transistor M0.

Figure 2B:
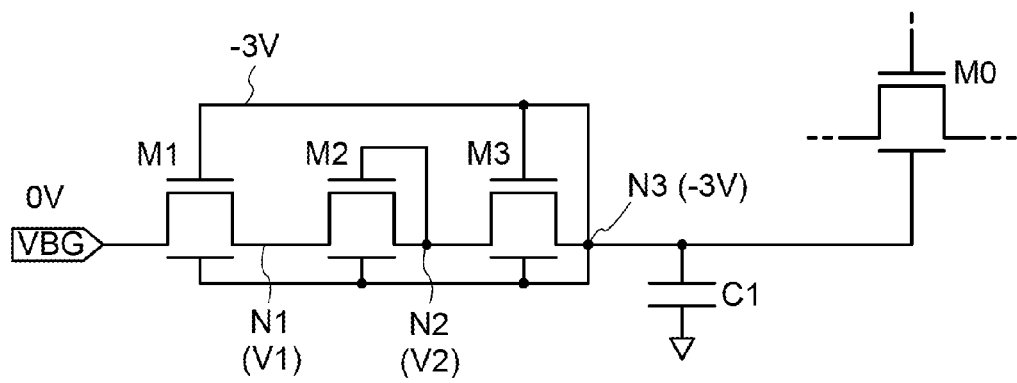

FIG. 2B is an example in which 0 V is applied to the input terminal VBG to retain −3 V applied to the second gate of the transistor M0.

When the potential of the node N1 and the potential of the node N2 are denoted by V1 and V2, respectively, the following magnitude relationship is established: 0 V >V1>V2>−3 V. At this time, $V_{gs}$ of the transistors M2 and M3 is 0 V, and $V_{gs}$ of the transistor M1 is obtained by subtracting V1 from −3 V, which is lower than 0 V (i.e., a negative potential). In other words, the transistors M1 to M3 are turned off.

At $V_{gs}$=0 V, there is no problem as long as off-state current of the transistors M2 and M3 is low. In the case where $V_{th}$ of the transistors M2 and M3 is low, the off-state current is high even at $V_{gs}=0$ V; thus, charge held in the second gate of the transistor M0 leaks through the transistors M2 and M3.

However, $V_{gs}$ of the transistor M1 is lower than 0 V; thus, the off-state current of the transistor M1 is sufficiently low and charge leakage can be stopped. Accordingly, the potential of the second gate of the transistor M0 can be held for a long time. When the transistors M1 to M3 includes the second gates, $V_{th}$ of the transistors M1 to M3 in FIGS. 2A and 2B can be increased and off-state current can be further reduced. Consequently, the potential of the second gate of the transistor M0 can be held for a longer time.

Figure 19A:
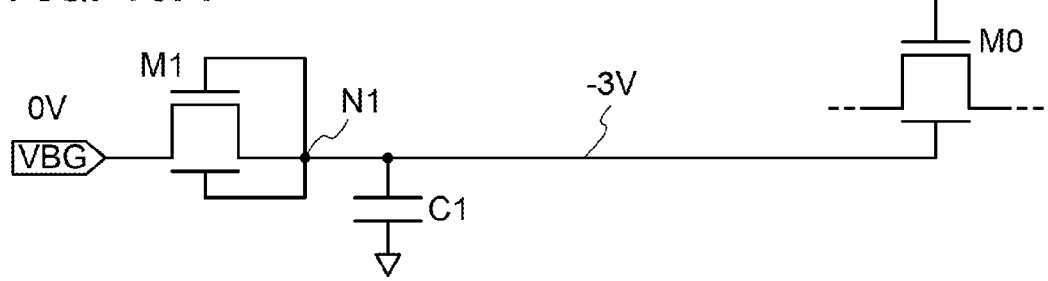
FIGS. 19A to 19C are circuit diagrams each illustrating an example of the driver circuit.
Figure 19B:
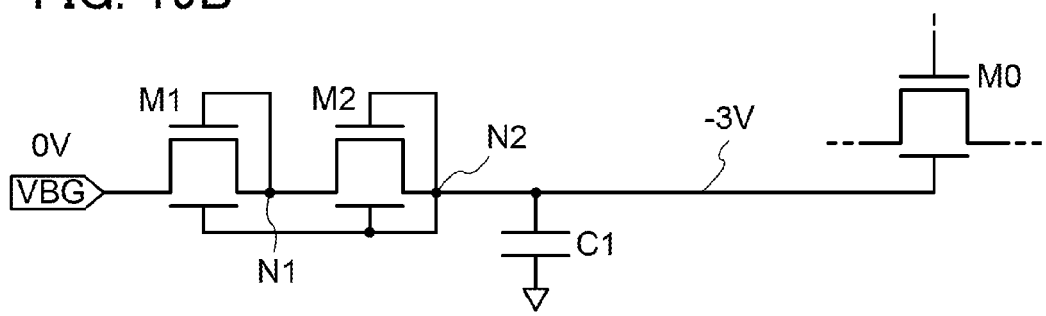
Figure 19C:
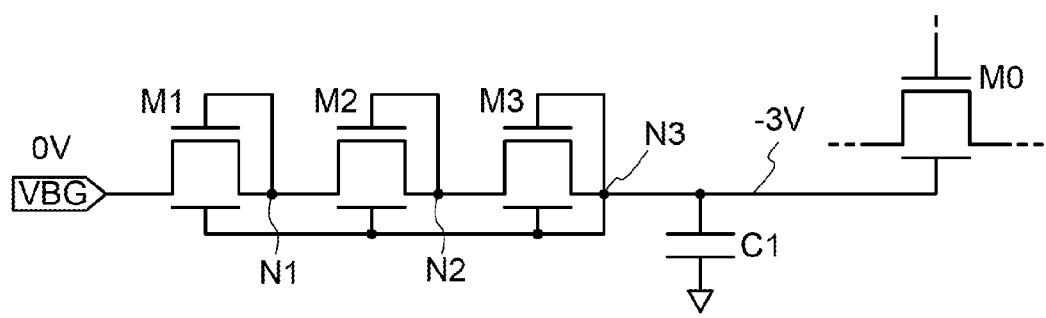

Here, circuits in FIGS. 19A to 19C are described.

As in FIG. 2B, the case is described in which −3 V is applied to the second gate of the transistor M0 in each of the circuits in FIGS. 19A to 19C and 0 V is applied to the input terminal VBG to hold −3 V.

In FIGS. 19A to 19C, $V_{gs}$ of the transistors M1 to M3 is 0 V. Thus, as described above, in the case where $V_{th}$ of the transistors M1 to M3 is low, off-state current flows, and the potential applied to the second gate of the transistor M0 cannot be held.

Consequently, the circuit 100 in FIG. 1 has excellent data retention characteristics.

Figure 3A:
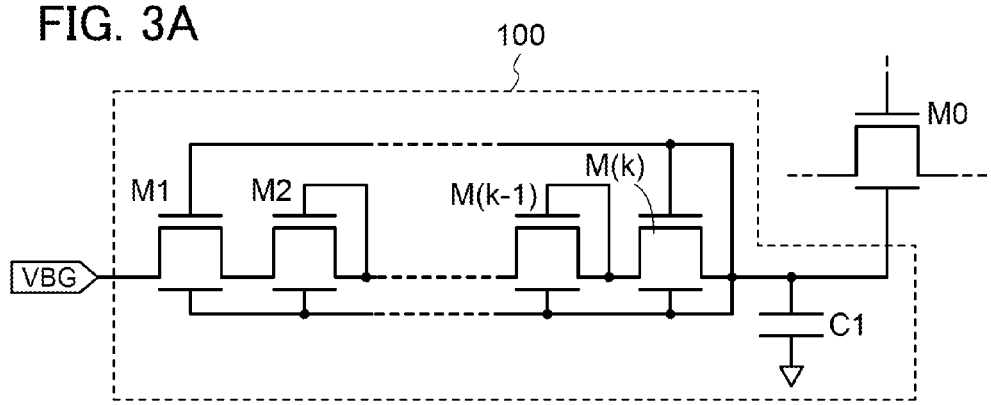
FIGS. 3A and 3B are circuit diagrams each illustrating an example of the driver circuit.

As in the circuit 100 in FIG. 3A, the transistor M2 to a transistor M(k) (k is a natural number of 3 or more) functioning as diodes may be electrically connected between the second gates of the transistors M1 and M0. Such a structure can decrease $V_{gs}$ of the transistor M1 and the off-state current of the transistor M1.

Figure 3B:
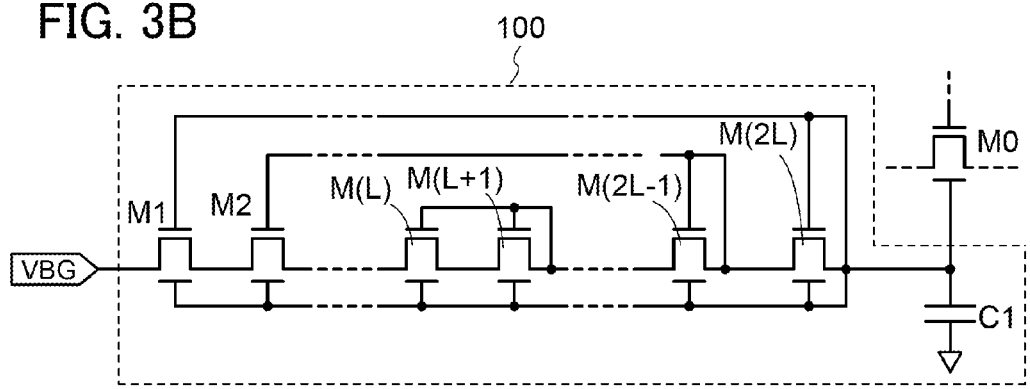

As in the circuit 100 in FIG. 3B, a transistor M(L+1) and a diode-connected transistor M(L) may be provided between the transistor M1 and a transistor M(2L) functioning as a diode. Note that L is a natural number of 2 or more. Such a structure can decrease $V_{gs}$ of the transistor M1 and the off-state current of the transistor M1.

Figure 4:
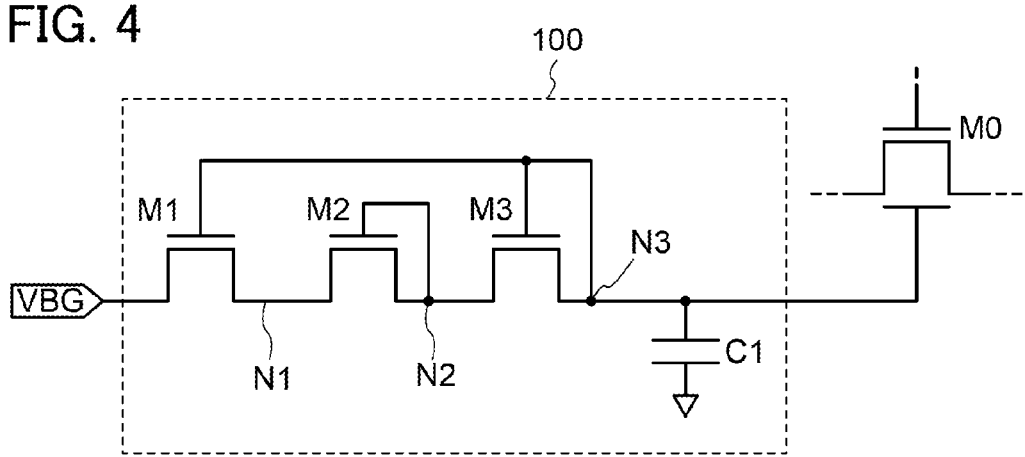
FIG. 4 is a circuit diagram illustrating an example of the driver circuit.

As in the circuit 100 in FIG. 4, the second gates of the transistors M1 to M3 may be omitted. When the second gates are omitted, the occupation areas of the transistors M1 to M3 can be reduced. Note that the second gates of the transistors M1 to M(k) in FIG. 3A and the transistors M1 to M(2L) in FIG. 3B may be omitted as in the transistors M1 to M3 in FIG. 4.

The structures, the methods, and the like described in this embodiment can be combined with any of the structures, the methods, and the like described in the other embodiments as appropriate.

Embodiment 2

In this embodiment, application examples of the circuit 100 described in Embodiment 1 are described with reference to FIGS. 5A and 5B, FIGS. 6A and 6B, FIG. 7, and FIGS. 8A and 8B.

<Nonvolatile Memory>

Figure 5A:
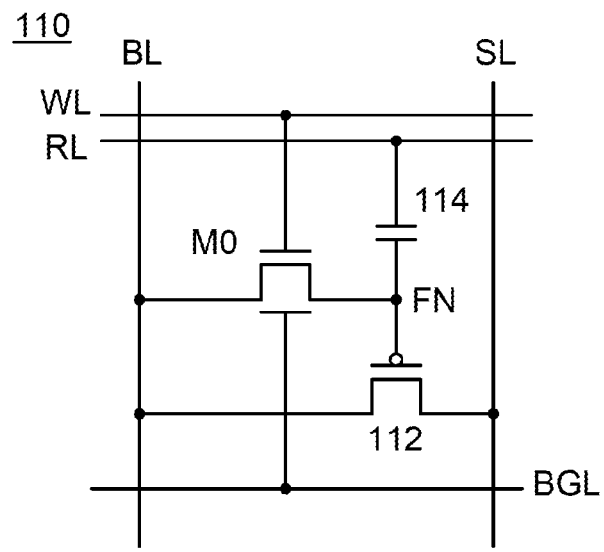
FIGS. 5A and 5B are circuit diagrams each illustrating a circuit structure example of a nonvolatile memory.

FIG. 5A illustrates the circuit structure of a memory cell 110 functioning as a storage element.

The memory cell 110 in FIG. 5A includes the transistor M0 including the first and second gates, a transistor 112, a capacitor 114, a node FN, a wiring BL, a wiring SL, a wiring WL, a wiring RL, and a wiring BGL.

In the memory cell 110 in FIG. 5A, the first gate of the transistor M0 is electrically connected to the wiring WL; the second gate of the transistor M0 is electrically connected to the wiring BGL; one of a source and a drain of the transistor M0 is electrically connected to the wiring BL; and the other of the source and the drain of the transistor M0 is electrically connected to the node FN.

In the memory cell 110 in FIG. 5A, a gate of the transistor 112 is electrically connected to the node FN; one of a source and a drain of the transistor 112 is electrically connected to the wiring BL; and the other of the source and the drain of the transistor 112 is electrically connected to the wiring SL.

In the memory cell 110 in FIG. 5A, a first terminal of the capacitor 114 is electrically connected to the wiring RL, and a second terminal of the capacitor 114 is electrically connected to the node FN.

The transistor M0 preferably has low off-state current. For example, the off-state current of the transistor M0 is preferably lower than or equal to $10^{-18}$ A/μm, more preferably lower than or equal to $10^{-21}$ A/μm, still more preferably lower than or equal to $10^{-24}$ A/μm. An oxide semiconductor transistor can be used as a transistor having low off-state current.

The transistor 112 preferably has little variation in threshold voltage. Here, transistors with little variation in threshold voltage refer to transistors fabricated in the same process to have an acceptable threshold voltage difference of 100 mV or less, and are specifically transistors including single crystal silicon in channels.

The memory cell 110 utilizes a characteristic in which the charge of the node FN can be held, so that data can be written, retained, and read as follows.

Data writing and data retention are described. First, a potential is applied to the wiring WL so that the transistor M0 is turned on. Accordingly, the potential of the wiring BL is applied to the node FN. That is, predetermined charge is supplied to the node FN (writing). Here, charge for applying either of two different potential levels (hereinafter referred to as a low level and a high level) is given. After that, the transistor M0 is turned off, so that the charge given to the node FN is held (storing).

Since the off-state current of the transistor M0 is extremely low, the charge of the gate of the transistor M0 is held for a long time.

Next, data reading is described. An appropriate potential (reading potential) is applied to the wiring RL while a predetermined potential (constant potential) is applied to the wiring SL, so that the potential of the wiring BL varies depending on the amount of charge held in the gate of the transistor 112. This is because in the case where the transistor 112 is a p-channel transistor, apparent threshold voltage $V_{th\_H}$ when a high level is supplied to the node FN is usually lower than apparent threshold voltage $V_{th\_L}$ when a low level is supplied to the node FN. Here, apparent threshold voltage refers to the potential of the wiring RL that is needed to turn on the transistor 112. Thus, when the potential of the wiring RL is set to a potential $V_0$ that is between $V_{th\_H}$ and $V_{th\_L}$, charge given to the gate of the transistor 112 can be determined. For example, in the case where the low level is supplied in data writing, the transistor 112 is turned on when the potential of the node FN is $V_0$ ($<V_{th\_L}$). In the case where the high-level charge is supplied in data writing, the transistor 112 remains in an off state even when the potential of the node FN is set to $V_0$ ($>V_{th\_H}$). Therefore, the retained data can be read by determining the potential of the wiring BL.

Note that although the transistor 112 is a p-channel transistor in the above description, one embodiment of the present invention is not limited thereto. The transistor 112 might be an n-channel transistor.

Figure 5B:
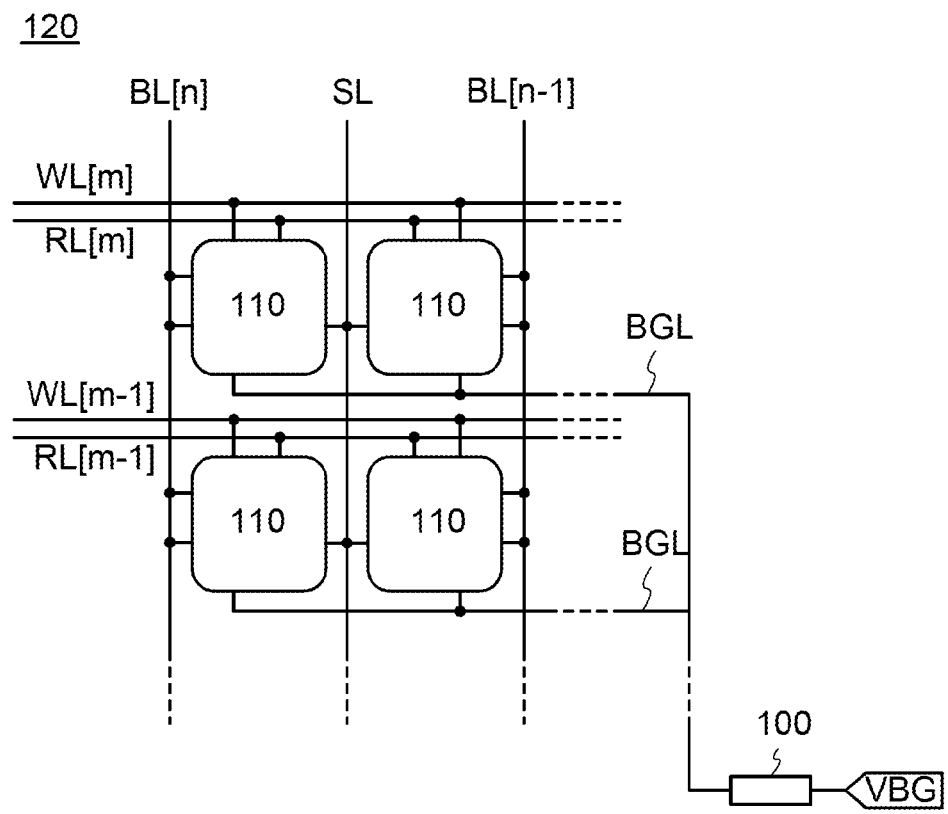

FIG. 5B illustrates the circuit structure of a storage device 120 including the memory cells 110 arranged in a matrix and the circuit 100 described in Embodiment 1. The storage device 120 functions as a nonvolatile memory.

The storage device 120 includes the memory cells 110 arranged in a matrix of m rows and n columns. Here, m and n are each a natural number of 2 or more. The memory cells 110 provided in an m-th row are electrically connected to wirings WL[m] and RL[m], and the memory cells 110 provided in an n-th column are electrically connected to a wiring BL[n] and the wiring SL.

The second gates of the transistors M0 included in the memory cells 110 are electrically connected to the circuit 100 through the wirings BGL. In other words, the circuit 100 has a function of supplying signals for controlling the second gates of the transistors M0 included in all the memory cells.

When the circuit 100 controls the second gate of the transistor M0, the transistor M0 can have appropriate $V_{th}$ and can be prevented from being normally-on. Consequently, the off-state current of the transistor M0 can be reduced, and the transistor M0 can hold charge given to the node FN.

When the storage device 120 has such a structure, it is possible to provide a storage device capable of retaining data for a long time even after the storage device is powered off.
<DRAM>

Figure 6A:
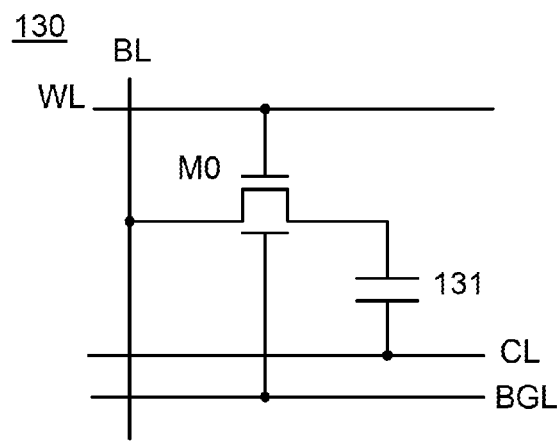
FIGS. 6A and 6B are circuit diagrams each illustrating a circuit structure example of a DRAM.

FIG. 6A illustrates the circuit structure of a memory cell 130 functioning as a storage element.

The memory cell 130 in FIG. 6A includes the transistor M0 including the first and second gates, a capacitor 131, the wiring BL, the wiring WL, a wiring CL, and the wiring BGL.

In the memory cell 130 in FIG. 6A, the first gate of the transistor M0 is electrically connected to the wiring WL; the second gate of the transistor M0 is electrically connected to the wiring BGL; one of the source and the drain of the transistor M0 is electrically connected to the wiring BL; and the other of the source and the drain of the transistor M0 is electrically connected to a first terminal of the capacitor 131. A second terminal of the capacitor 131 is electrically connected to the wiring CL.

The transistor M0 preferably has low off-state current. For example, the off-state current of the transistor M0 is preferably lower than or equal to $10^{-18}$ A/μm, more preferably lower than or equal to $10^{-21}$ A/μm, still more preferably lower than or equal to $10^{-24}$ A/μm. An oxide semiconductor transistor can be used as a transistor having low off-state current.

The wiring WL has a function of supplying signals for controlling the on/off state of the transistor M0, and the wiring BL has a function of giving charge to the capacitor 131 through the transistor M0. By turning off the transistor M0 after charge is given to the capacitor 131, the charge given to the capacitor 131 can be held.

Since the charge given to the capacitor 131 leaks to the outside through the transistor M0, operation of rewiting (refreshing) the charge given to the capacitor 131 at regular intervals is needed. However, the refresh frequency is low because the off-state current of the transistor M0 is extremely low and the amount of charge that leaks from the capacitor 131 is small.

Figure 6B:
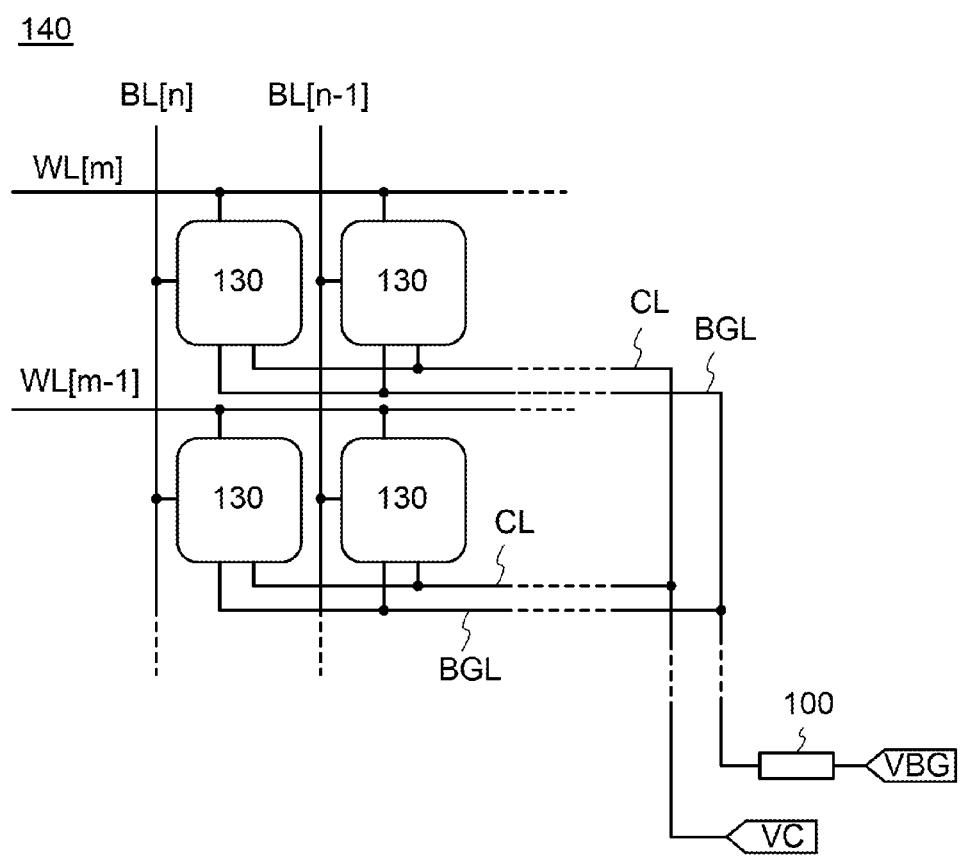

FIG. 6B illustrates the circuit structure of a storage device 140 including the memory cells 130 arranged in a matrix and the circuit 100 described in Embodiment 1. The storage device 140 functions as a DRAM.

The storage device 140 includes the memory cells 130 arranged in a matrix of m rows and n columns. The memory cells 130 provided in the m-th row are electrically connected to the wiring WL[m], and the memory cells 130 provided in the n-th column are electrically connected to the wiring BL[n]. The wiring CL is electrically connected to a terminal VC for applying a constant low potential.

The second gates of the transistors M0 included in the memory cells 130 are electrically connected to the circuit 100 through the wirings BGL. In other words, the circuit 100 has a function of supplying signals for controlling the second gates of the transistors M0 included in all the memory cells.

When the circuit 100 controls the second gate of the transistor M0, the transistor M0 can have appropriate $V_{th}$ and can be prevented from being normally-on. Consequently, the off-state current of the transistor M0 can be reduced, and the transistor M0 can hold charge given to the capacitor 131.

When the storage device 140 has such a structure, it is possible to provide a storage device capable of operating at low power with infrequent refresh operation.
<Register>

Figure 7:
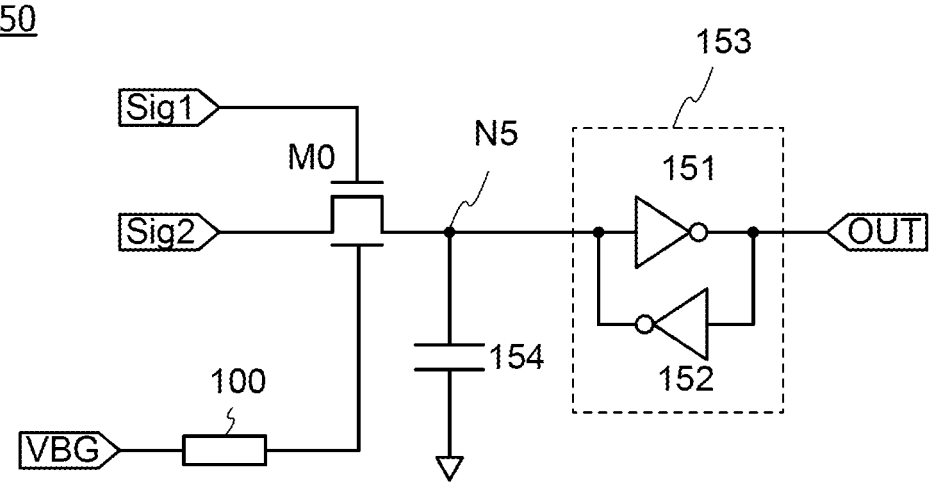
FIG. 7 is a circuit diagram illustrating a circuit structure example of a register.

FIG. 7 illustrates a structure example of a 1-bit register circuit 150.

The register circuit 150 includes the transistor M0 including the first and second gates, a capacitor 154, a node N5, and a flip-flop circuit 153.

The flip-flop circuit 153 includes inverters 151 and 152. The inverter 151 whose direction is opposite to the direction of the inverter 152 is connected in parallel with the inverter 152, and a node to which an output side of the inverter 151 is connected corresponds to an output terminal OUT of the register circuit 150.

The second gate of the transistor M0 is electrically connected to the circuit 100; the first gate of the transistor M0 is electrically connected to an input terminal Sig1; one of the source and the drain of the transistor M0 is electrically connected to an input terminal Sig2; and the other of the source and the drain of the transistor M0 is electrically connected to the node N5.

A first terminal of the capacitor 154 is electrically connected to the node N5, and a constant low potential is applied to a second terminal of the capacitor 154. The ground potential may be applied as the low potential. The node N5 is electrically connected to the flip-flop circuit 153.

The transistor M0 preferably has low off-state current. For example, the off-state current of the transistor M0 is preferably lower than or equal to $10^{-18}$ A/μm, more preferably lower than or equal to $10^{-21}$ A/μm, still more preferably lower than or equal to $10^{-24}$ A/μm. An oxide semiconductor transistor can be used as a transistor having low off-state current.

The register circuit 150 stores and outputs data with input signals from the input terminals Sig1 and Sig2. For example, when high-level voltages are input from the input terminals Sig1 and Sig2, the transistor M0 is turned on, so that high-level voltage is input to the node N5. Accordingly, low-level voltage obtained by inversion in the inverter 151 is output from the output terminal OUT of the register circuit 150, and at the same time, data of the low-level voltage is stored in the flip-flop circuit 153. In contrast, when low-level voltage is input from the input terminal Sig2, high-level voltage is output from the output terminal OUT similarly, and data of the high-level voltage is stored in the flip-flop circuit 153.

The capacitor 154 has a function of holding the voltage of the node N5.

The register circuit 150 can hold the potential of the node N5 even if supply of power supply voltage is stopped by turning off the transistor M0 after a potential is applied from the input terminal Sig2 to the node N5. This is because the off-state current of the transistor M0 is extremely low. In other words, by using the register circuit 150, it is possible to provide a storage device that can retain data even after supply of power supply voltage is stopped.

The circuit 100 has a function of supplying signals for controlling the second gate of the transistor M0. When the circuit 100 controls the second gate of the transistor M0, the transistor M0 can have appropriate $V_{th}$ and can be prevented from being normally-on. Consequently, the off-state current of the transistor M0 can be reduced, and the transistor M0 can hold charge given to the node N5.

Note that in this embodiment, a simple structure of two inverter circuits is described as an example of the flip-flop circuit 153; however, one embodiment of the present invention is not limited to this structure. A clocked inverter capable of performing clock operation or a structure in which a NAND circuit and an inverter are combined can be used as appropriate. For example, a known flip-flop circuit such as an RS flip-flop circuit, a JK flip-flop circuit, a D flip-flop circuit, or a T flip-flop circuit can be used as appropriate.

<Display Device>

Figure 8A:
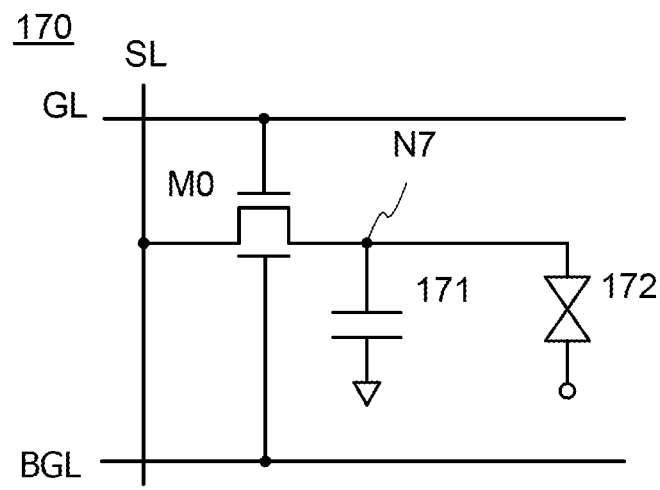
FIGS. 8A and 8B are circuit diagrams each illustrating a circuit structure example of a display device.
Figure 8B:
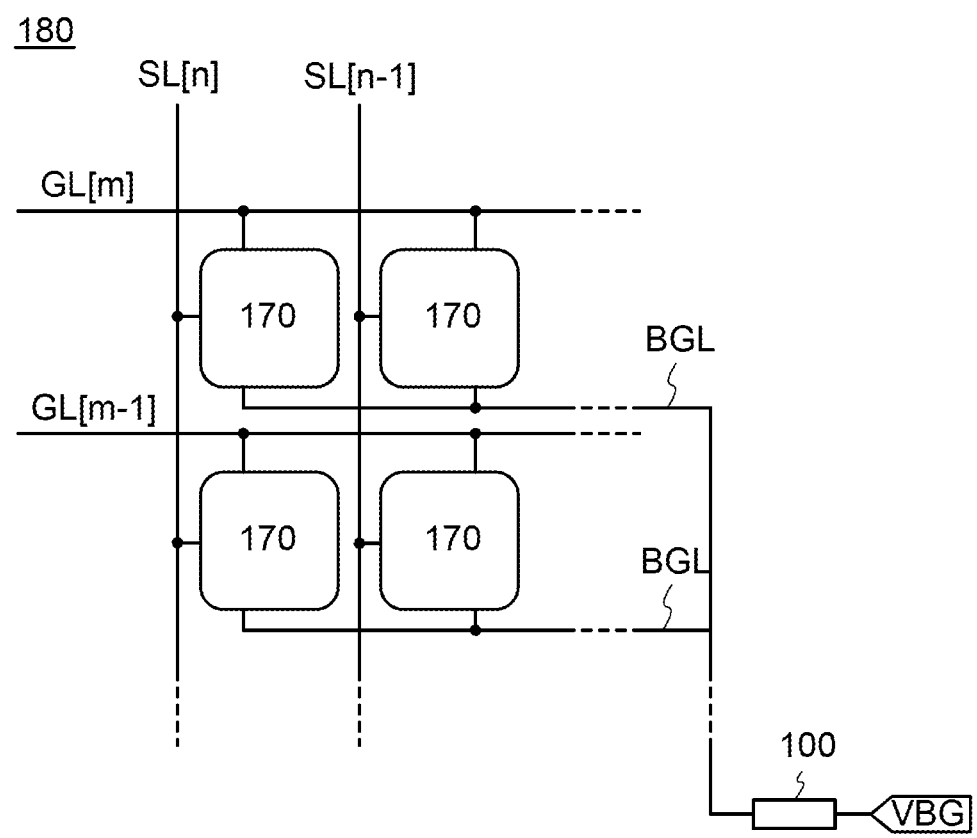

FIGS. 8A and 8B each illustrate an example in which the circuit 100 in Embodiment 1 is used in a display device.

FIG. 8A illustrates a structure example of a pixel 170 that can be used in a display device. The pixel 170 includes the transistor M0 including the first and second gates, a capacitor 171, a display element 172, a node N7, a wiring GL, the wiring SL, and the wiring BGL.

The first gate of the transistor M0 is electrically connected to the wiring GL; the second gate of the transistor M0 is electrically connected to the wiring BGL; one of the source and the drain of the transistor M0 is electrically connected to the wiring SL; and the other of the source and the drain of the transistor M0 is electrically connected to the node N7.

A first terminal of the capacitor 171 is electrically connected to the node N7, and a constant low potential is applied to a second terminal of the capacitor 171.

The capacitor 171 may be provided as needed. In the case where parasitic capacitance of an electrode, a wiring, or the like can be used as capacitance needed to drive the pixel 170, the capacitor 171 may be omitted.

The transistor M0 preferably has low off-state current. For example, the off-state current of the transistor M0 is preferably lower than or equal to $10^{-18}$ A/μm, more preferably lower than or equal to $10^{-21}$ A/μm, still more preferably lower than or equal to $10^{-24}$ A/μm. An oxide semiconductor transistor can be used as a transistor having low off-state current.

A first terminal of the display element 172 is electrically connected to the node N7, and a constant low potential is applied to a second terminal of the display element 172. The ground potential may be applied as the low potential. A dielectric element whose optical characteristics are changed when voltage is applied to its electrodes at opposite ends can be used as the display element 172. For example, a liquid crystal element or an element used for electronic paper or the like, such as an electrophoretic element or a twisting ball element, can be used.

The wiring GL has a function of supplying signals for controlling the on/off state of the transistor M0, and the wiring SL has a function of supplying voltage applied to the display element 172 through the transistor M0.

Since the off-state current of the transistor M0 is extremely low, when the transistor M0 is turned off, the node N7 can hold voltage applied immediately before turning off the transistor M0. While the voltage of the node N7 is held, the display element 172 can maintain its display state.

The pixel 170 can hold the voltage of the node N7 for a long time. Thus, the optical characteristics of the display element 172 can be unchanged even when supply of power supply voltage is stopped. For example, even in the case where a liquid crystal element that cannot store data, such as a twisted nematic (TN) liquid crystal, is used, the element can be always maintained in a state in which voltage is applied. Consequently, it is possible to exclude rewrite operation or it is possible to reduce the frequency of rewrite operation markedly.

FIG. 8B illustrates the circuit structure of a display device 180 including the pixels 170 arranged in a matrix and the circuit 100 described in Embodiment 1.

The display device 180 includes the pixels 170 arranged in a matrix of m rows and n columns. The pixels 170 provided in the m-th row are electrically connected to a wiring GL[m], and the pixels 170 provided in the n-th column are electrically connected to a wiring SL[n]

The second gates of the transistors M0 included in the pixels 170 are electrically connected to the circuit 100 through the wirings BGL. In other words, the circuit 100 has a function of supplying signals for controlling the second gates of the transistors M0 included in all the pixels.

When the circuit 100 controls the second gate of the transistor M0, the transistor M0 can have appropriate $V_{th}$ and can be prevented from being normally-on. Consequently, the off-state current of the transistor M0 can be reduced, and the transistor M0 can hold charge given to the node N7.

The circuit 100 can control and hold the threshold voltages of the transistors M0 in the pixels 170 connected to the circuit 100 at optimal levels and can temporarily change the threshold voltages so that the transistors M0 are set as normally-on transistors. When m×n transistors connected to the circuit 100 are temporarily changed into normally-on transistors, voltage (i.e., display images) stored in the pixels can be refreshed at the same time by one signal.

When the display device 180 has such a structure, it is possible to provide a display device capable of operating at low power with infrequent rewrite operation. In addition, it is possible to obtain a display device including a plurality of pixels that can easily perform refresh operation. Furthermore, it is possible to obtain a display device capable of displaying an image even when supply of power is stopped.

The structures, the methods, and the like described in this embodiment can be combined with any of the structures, the methods, and the like described in the other embodiments as appropriate.

Embodiment 3

In this embodiment, examples of transistors that can be used as the transistors M0 to M3 described in Embodiments 1 and 2 are described.

<Structure Example 1 of Transistor>

FIGS. 9A to 9D are a top view and cross-sectional views illustrating a transistor 600. FIG. 9A is the top view. FIG. 9B illustrates a cross section taken along dashed-dotted line Y1-Y2 in FIG. 9A. FIG. 9C illustrates a cross section taken along dashed-dotted line X1-X2 in FIG. 9A. FIG. 9D illustrates a cross section taken along dashed-dotted line X3-X4 in FIG. 9A. In FIGS. 9A to 9D, some components are scaled up or down or omitted for easy understanding. In some cases, the direction of dashed-dotted line Y1-Y2 is referred to as a channel length direction and the direction of dashed-dotted line X1-X2 is referred to as a channel width direction.

Note that the channel length refers to, for example, a distance between a source (a source region or a source electrode) and a drain (a drain region or a drain electrode) in a region where a semiconductor (or a portion where current flows in a semiconductor when a transistor is on) and a gate electrode overlap with each other or in a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where current flows in a semiconductor when a transistor is on) and a gate electrode overlap with each other or a region where a channel is formed. In one transistor, channel widths in all regions do not necessarily have the same value. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter referred to as an effective channel width) is sometimes different from a channel width shown in a top view of a transistor (hereinafter referred to as an apparent channel width). For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In a transistor having a three-dimensional structure, measuring an effective channel width is difficult in some cases. For example, to estimate an effective channel width from a design value, it is necessary to assume that the shape of a semiconductor is known. Therefore, in the case where the shape of a semiconductor is not known accurately, measuring an effective channel width accurately is difficult.

Accordingly, in this specification, in a top view of a transistor, an apparent channel width that is the length of a portion where a source and a drain face each other in a region where a semiconductor and a gate electrode overlap with each other is referred to as a surrounded channel width (SCW) in some cases. Furthermore, in this specification, the term "channel width" may denote a surrounded channel width, i.e., an apparent channel width or an effective channel width. Note that the values of a channel length, a channel width, an effective channel width, an apparent channel width, a surrounded channel width, and the like can be determined by obtaining and analyzing a cross-sectional TEM image and the like.

A surrounded channel width may be used to calculate field-effect mobility, a current value per channel width, and the like of a transistor. In this case, the obtained value is sometimes different from the value obtained by using an effective channel width for the calculation.

The transistor 600 includes a substrate 640; an insulating film 651 over the substrate 640; a conductive film 674 formed over the insulating film 651; an insulating film 656 formed over the insulating film 651 and the conductive film 674; an insulating film 652 formed over the insulating film 656; a layer in which semiconductors 661 and 662 are sequentially stacked over the insulating film 652; conductive films 671 and 672 in contact with a top surface of the semiconductor 662; a semiconductor 663 in contact with the semiconductors 661 and 662 and the conductive films 671 and 672; an insulating film 653 and a conductive film 673 over the semiconductor 663; an insulating film 654 over the conductive film 673 and the insulating film 653; and an insulating film 655 over the insulating film 654. Note that the semiconductors 661 to 663 are collectively referred to as a semiconductor 660.

The conductive film 671 functions as a source electrode of the transistor 600. The conductive film 672 functions as a drain electrode of the transistor 600.

The conductive film 673 functions as a first gate electrode of the transistor 600.

The insulating film 653 functions as a first gate insulating film of the transistor 600.

The conductive film 674 functions as a second gate electrode of the transistor 600.

The insulating films 656 and 652 function as a second gate insulating film of the transistor 600.

As illustrated in FIG. 9C, a side surface of the semiconductor 662 is surrounded by the conductive film 673. With such a structure, the semiconductor 662 can be electrically surrounded by an electric field of the conductive film 673 (a structure in which a semiconductor is electrically surrounded by an electric field of a conductive film (gate electrode) is referred to as a surrounded channel (s-channel) structure). Therefore, a channel is formed in the entire semiconductor 662 (bulk) in some cases. In the s-channel structure, a large amount of current can flow between a source and a drain of a transistor, so that high current in an on state (on-state current) can be achieved. The s-channel structure enables a transistor to operate at high frequency.

Since high on-state current can be obtained, the s-channel structure is suitable for a semiconductor device that needs a miniaturized transistor, such as a large scale integration (LSI) circuit. A semiconductor device including the miniaturized transistor can have a high integration degree and high density. For example, the channel length of the transistor is preferably greater than or equal to 10 nm and less than 1 μm, more preferably greater than or equal to 10 nm and less than 100 nm, still more preferably greater than or equal to 10 nm and less than 60 nm, particularly preferably greater than or equal to 10 nm and less than 30 nm.

Since high on-state current can be obtained, the s-channel structure is suitable for a transistor that needs to operate at high frequency. A semiconductor device including the transistor can operate at high frequency.

Since high on-state current can be obtained, the s-channel structure is suitable for a transistor for controlling power. In the case where the transistor for controlling power has the s-channel structure, the channel length of the transistor is preferably long because high withstand voltage is needed. For example, the channel length of the transistor is preferably greater than or equal to 1 μm, more preferably greater than or equal to 10 μm, still more preferably greater than or equal to 100 μm.

The insulating film 651 has a function of electrically isolating the substrate 640 and the conductive film 674 from each other.

The insulating film 652 preferably contains an oxide. In particular, the insulating film 652 preferably contains an oxide material from which part of oxygen is released by heating. The insulating film 652 preferably contains an oxide containing oxygen more than that in the stoichiometric composition. Part of oxygen is released by heating from an oxide film containing oxygen more than that in the stoichiometric composition. Oxygen released from the insulating film 652 is supplied to the semiconductor 660 that is an oxide semiconductor, so that oxygen vacancies in the oxide semiconductor can be reduced. Consequently, changes in the electrical characteristics of the transistor can be reduced and the reliability of the transistor can be improved.

The oxide film containing oxygen more than that in the stoichiometric composition is an oxide film of which the amount of released oxygen converted into oxygen atoms is greater than or equal to $1.0 \times 10^{18}$ atoms/cm³, preferably greater than or equal to $3.0 \times 10^{20}$ atoms/cm³ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C.

The insulating film 656 has a function of preventing oxygen contained in the insulating film 652 from decreasing by bonding to metal contained in the conductive film 674.

The insulating film 654 has a function of blocking oxygen, hydrogen, water, alkali metal, alkaline earth metal, and the like. The insulating film 654 can prevent outward diffusion of oxygen from the semiconductor 660 and entry of hydrogen, water, or the like into the semiconductor 660 from the outside.

<Semiconductor>

Next, an oxide semiconductor that can be used as the semiconductor 661, the semiconductor 662, the semiconductor 663, or the like is described.

As the transistor 600, a transistor having low current that flows between a source and a drain in an off state (low off-state current) is preferably used. Here, low off-state current means that normalized off-state current per micrometer of channel width at room temperature with a source-drain voltage of 10 V is lower than or equal to $10 \times 10^{-21}$ A. An example of a transistor with such low off-state current is a transistor including an oxide semiconductor as a semiconductor.

The semiconductor 662 is an oxide semiconductor containing indium (In), for example. The semiconductor 662 can have high carrier mobility (electron mobility) by containing indium, for example. The semiconductor 662 preferably contains an element M. The element M is preferably aluminum (Al), gallium (Ga), yttrium (Y), tin (Sn), or the like. Other elements that can be used as the element M are boron (B), silicon (Si), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), and the like. Note that two or more of these elements may be used in combination as the element M. The element M is an element having high bonding energy with oxygen, for example. The element M is an element whose bonding energy with oxygen is higher than that of indium, for example. The element M is an element that can increase the energy gap of the oxide semiconductor, for example. Furthermore, the semiconductor 662 preferably contains zinc (Zn). When the oxide semiconductor contains zinc, the oxide semiconductor is easily to be crystallized in some cases.

Note that the semiconductor 662 is not limited to the oxide semiconductor containing indium. The semiconductor 662 may be, for example, an oxide semiconductor that does not contain indium and contains zinc, such as a zinc tin oxide or a gallium tin oxide, an oxide semiconductor containing gallium, or an oxide semiconductor containing tin.

For the semiconductor 662, an oxide with a wide energy gap is used. The energy gap of the semiconductor 662 is, for example, greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

A CAAC-OS film described later is preferably used for the semiconductor 662.

For example, the semiconductors 661 and 663 include one or more, or two or more elements other than oxygen included in the semiconductor 662. Since the semiconductors 661 and 663 include one or more, or two or more elements other than oxygen included in the semiconductor 662, an interface state is less likely to be formed at an interface between the semiconductors 661 and 662 and an interface between the semiconductors 662 and 663.

In the case of using an In-M-Zn oxide as the semiconductor 661, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively. When the semiconductor 661 is formed by sputtering, a sputtering target with the above composition is preferably used. For example, In:M:Zn is preferably 1:3:2.

In the case of using an In-M-Zn oxide as the semiconductor 662, when the total proportion of In and M is assumed to be 100 atomic %, the proportions of In and M are preferably set to be higher than 25 atomic % and lower than 75 atomic %, respectively, more preferably higher than 34 atomic % and lower than 66 atomic %, respectively. When the semiconductor 662 is formed by sputtering, a sputtering target with the above composition is preferably used. For example, In:M:Zn is preferably 1:1:1, 1:1:1.2, 2:1:3, 3:1:2, or 4:2:4.1. In particular, when a sputtering target with an atomic ratio of In to Ga and Zn of 4:2:4.1 is used, the atomic ratio of In to Ga and Zn in the semiconductor 662 may be 4:2:3 or in the neighborhood of 4:2:3.

In the case of using an In-M-Zn oxide as the semiconductor 663, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively. The semiconductor 663 may be an oxide that is the same type as that of the semiconductor 661. Note that the semiconductor 661 and/or the semiconductor 663 does not necessarily contain indium in some cases. For example, the semiconductor 661 and/or the semiconductor 663 may be gallium oxide.

Figure 10A:
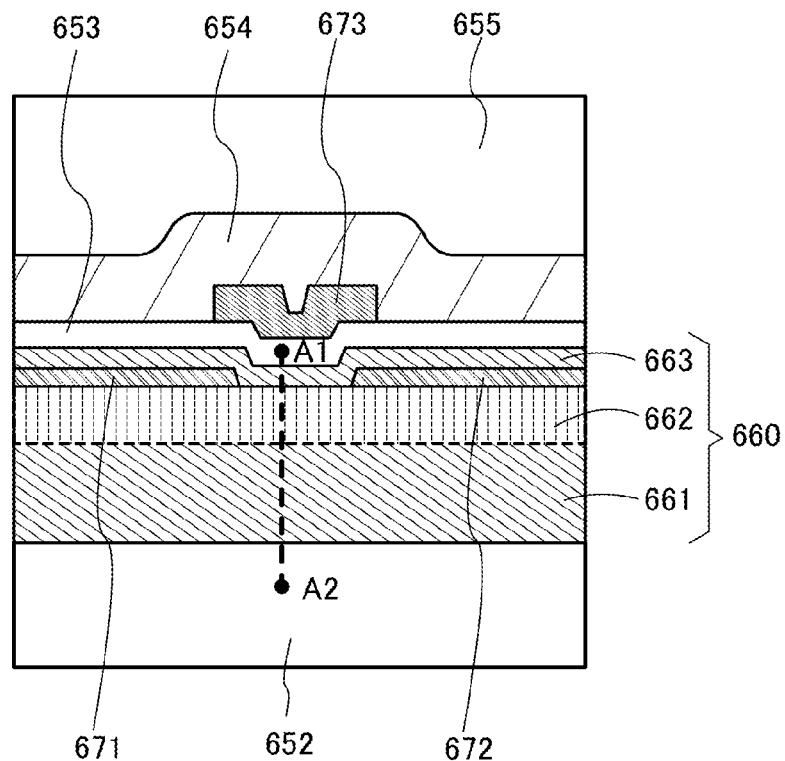
FIGS. 10A and 10B are a cross-sectional view of a transistor and an energy band diagram of the transistor.
Figure 10B:
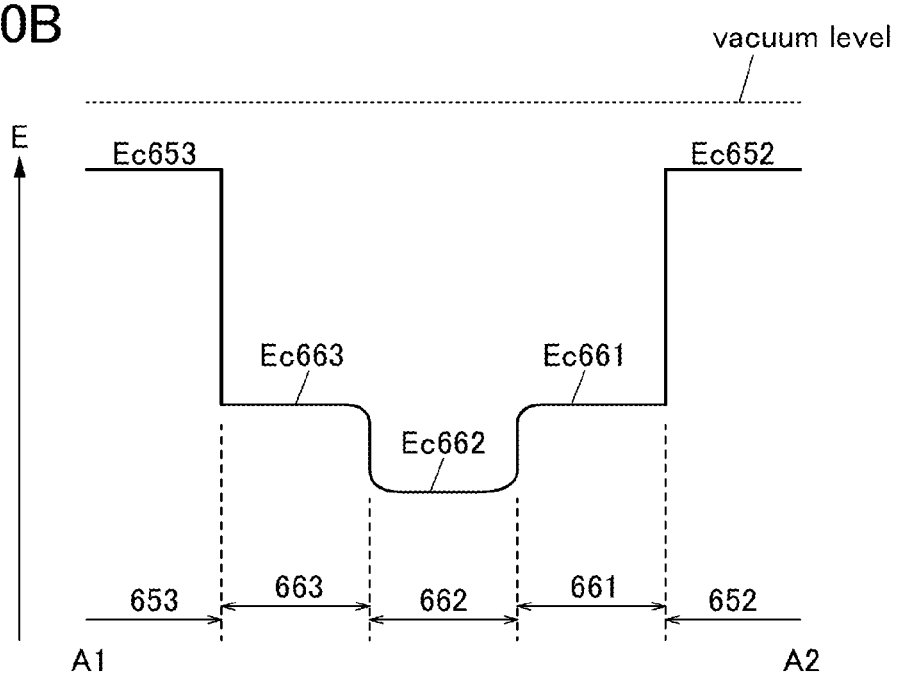

Next, a function and an effect of the semiconductor 660 in which the semiconductors 661 to 663 are stacked are described using an energy band diagram in FIG. 10B. FIG. 10A is an enlarged view of the channel portion of the transistor 600 illustrated in FIG. 10B. FIG. 10B shows the energy band structure of a portion taken along chain line A1-A2 in FIG. 10A. That is, FIG. 10B shows the energy band structure of a channel formation region of the transistor 600.

In FIG. 10B, Ec652, Ec661, Ec662, Ec663, and Ec653 indicate the energy of the conduction band minimum of the insulating film 652, the semiconductor 661, the semiconductor 662, the semiconductor 663, and the insulating film 653, respectively.

Here, a difference in energy between the vacuum level and the conduction band minimum (the difference is also referred to as electron affinity) corresponds to a value obtained by subtracting an energy gap from a difference in energy between the vacuum level and the valence band maximum (the difference is also referred to as ionization potential). The energy gap can be measured using a spectroscopic ellipsometer. The energy difference between the vacuum level and the valence band maximum can be measured using an ultraviolet photoelectron spectroscopy (UPS) device.

Since the insulating films 652 and 653 are insulators, Ec652 and Ec653 are closer to the vacuum level than Ec661 to Ec663 (i.e., the insulating films 652 and 653 have lower electron affinity than the semiconductors 661 to 663).

As the semiconductor 662, an oxide having an electron affinity higher than those of the semiconductors 661 and 663 is used. For example, as the semiconductor 662, an oxide having an electron affinity higher than those of the semiconductors 661 and 663 by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used. Note that electron affinity is an energy gap between the vacuum level and the bottom of the conduction band.

An indium gallium oxide has low electron affinity and a high oxygen-blocking property. Therefore, the semiconductor 663 preferably includes an indium gallium oxide. The gallium atomic ratio [Ga/(In+Ga)] is, for example, higher than or equal to 70%, preferably higher than or equal to 80%, more preferably higher than or equal to 90%.

At this time, when gate voltage is applied, a channel is formed in the semiconductor 662 having the highest electron affinity in the semiconductors 661 to 663.

Here, in some cases, there is a mixed region of the semiconductors 661 and 662 between the semiconductors 661 and 662. Furthermore, in some cases, there is a mixed region of the semiconductors 662 and 663 between the semiconductors 662 and 663. The mixed region has low interface state density. For that reason, the stack of the semiconductors 661 to 663 has a band structure where energy at each interface is changed continuously (continuous junction).

At this time, electrons move mainly in the semiconductor 662, not in the semiconductors 661 and 663. As described above, when the interface state density at the interface between the semiconductors 661 and 662 and the interface state density at the interface between the semiconductors 662 and 663 are decreased, electron movement in the semiconductor 662 is less likely to be inhibited and the on-state current of the transistor can be increased.

As factors of inhibiting electron movement are decreased, the on-state current of the transistor can be increased. For example, in the case where there is no factor of inhibiting electron movement, electrons are assumed to be moved efficiently. Electron movement is inhibited, for example, in the case where physical unevenness in a channel formation region is large.

To increase the on-state current of the transistor, for example, root mean square (RMS) roughness with a measurement area of 1 μm×1 μm of a top surface or a bottom surface of the semiconductor 662 (a formation surface; here, the semiconductor 661) is less than 1 nm, preferably less than 0.6 nm, more preferably less than 0.5 nm, still more preferably less than 0.4 nm. The average surface roughness (Ra) with the measurement area of 1 μm×1 μm is less than 1 nm, preferably less than 0.6 nm, more preferably less than 0.5 nm, still more preferably less than 0.4 nm. The maximum difference (P–V) with the measurement area of 1 μm×1 μm is less than 10 nm, preferably less than 9 nm, more preferably less than 8 nm, still more preferably less than 7 nm. RMS roughness, Ra, and P–V can be measured using a scanning probe microscope SPA-500 manufactured by SII Nano Technology Inc.

The electron movement is also inhibited, for example, in the case where the density of defect states is high in a region where a channel is formed.

For example, in the case where the semiconductor 662 contains oxygen vacancies ($V_O$), donor levels are formed by entry of hydrogen into sites of oxygen vacancies in some cases. A state in which hydrogen enters sites of oxygen vacancies are denoted by $V_OH$ in the following description in some cases. $V_OH$ is a factor of decreasing the on-state current of the transistor because $V_OH$ scatters electrons. Note that sites of oxygen vacancies become more stable by entry of oxygen than by entry of hydrogen. Thus, by decreasing oxygen vacancies in the semiconductor 662, the on-state current of the transistor can be increased in some cases.

For example, at a certain depth in the semiconductor 662 or in a certain region of the semiconductor 662, the concentration of hydrogen measured by secondary ion mass spectrometry (SIMS) is set to be higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms/cm$^3$, still more preferably higher than or equal to $1\times10^{16}$ atoms/cm$^3$ and lower than or equal to $5\times10^{18}$ atoms/cm$^3$.

To decrease oxygen vacancies in the semiconductor 662, for example, there is a method in which excess oxygen in the insulating film 652 is moved to the semiconductor 662 through the semiconductor 661. In that case, the semiconductor 661 is preferably a layer having an oxygen-transmitting property (a layer through which oxygen is transmitted).

In the case where the transistor has an s-channel structure, a channel is formed in the entire semiconductor 662. Therefore, as the semiconductor 662 has larger thickness, a channel region becomes larger. In other words, the thicker the semiconductor 662 is, the larger the on-state current of the transistor is.

Moreover, the thickness of the semiconductor 663 is preferably as small as possible to increase the on-state current of the transistor. For example, the semiconductor 663 has a region with a thickness of less than 10 nm, preferably less than or equal to 5 nm, more preferably less than or equal to 3 nm. Meanwhile, the semiconductor 663 has a function of blocking entry of elements other than oxygen (such as hydrogen and silicon) included in the adjacent insulator into the semiconductor 662 where a channel is formed. Thus, the semiconductor 663 preferably has a certain thickness. For example, the semiconductor 663 may have a region with a thickness of greater than or equal to 0.3 nm, preferably greater than or equal to 1 nm, more preferably greater than or equal to 2 nm. The semiconductor 663 preferably has an oxygen blocking property to inhibit outward diffusion of oxygen released from the insulating film 652 and the like.

To improve reliability, preferably, the thickness of the semiconductor 661 is large and the thickness of the semiconductor 663 is small. For example, the semiconductor 661 has a region with a thickness of greater than or equal to 10 nm, preferably greater than or equal to 20 nm, more preferably greater than or equal to 40 nm, still more preferably greater than or equal to 60 nm. When the thickness of the semiconductor 661 is made large, a distance from an interface between the adjacent insulator and the semiconductor 661 to the semiconductor 662 in which a channel is formed can be large. Note that the semiconductor 661 has a region with a thickness of, for example, less than or equal to 200 nm, preferably less than or equal to 120 nm, more preferably less than or equal to 80 nm because the productivity of the semiconductor device might be decreased.

For example, a region in which the concentration of silicon measured by SIMS is higher than or equal to $1\times10^{16}$ atoms/cm$^3$ and lower than $1\times10^{19}$ atoms/cm$^3$, preferably higher than or equal to $1\times10^{16}$ atoms/cm$^3$ and lower than $5\times10^{18}$ atoms/cm$^3$, more preferably higher than or equal to $1\times10^{16}$ atoms/cm$^3$ and lower than $2\times10^{18}$ atoms/cm$^3$ is provided between the semiconductors 661 and 662. A region in which the concentration of silicon measured by SIMS is higher than or equal to $1\times10^{16}$ atoms/cm$^3$ and lower than $1\times10^{19}$ atoms/cm$^3$, preferably higher than or equal to $1\times10^{16}$ atoms/cm$^3$ and lower than $5\times10^{18}$ atoms/cm$^3$, more preferably higher than or equal to $1\times10^{16}$ atoms/cm$^3$ and lower than $2\times10^{18}$ atoms/cm$^3$ is provided between the semiconductors 662 and 663.

It is preferable to reduce the concentration of hydrogen in the semiconductors 661 and 663 in order to reduce the concentration of hydrogen in the semiconductor 662. The semiconductors 661 and 663 each have a region in which the concentration of hydrogen measured by SIMS is higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms/cm$^3$, still more preferably higher than or equal to $1\times10^{16}$ atoms/cm$^3$ and lower than or equal to $5\times10^{18}$ atoms/cm$^3$. It is preferable to reduce the concentration of nitrogen in the semiconductors 661 and 663 in order to reduce the concentration of nitrogen in the semiconductor 662. The semiconductors 661 and 663 each have a region in which the concentration of nitrogen measured by SIMS is higher than or equal to $1\times10^{16}$ atoms/cm$^3$ and lower than $5\times10^{19}$ atoms/cm$^3$, preferably higher than or equal to $1\times10^{16}$ atoms/cm$^3$ and lower than or equal to $5\times10^{18}$ atoms/cm$^3$, more preferably higher than or equal to $1\times10^{16}$ atoms/cm$^3$ and lower than or equal to $1\times10^{18}$ atoms/cm$^3$, still more preferably higher than or equal to $1\times10^{16}$ atoms/cm$^3$ and lower than or equal to $5\times10^{17}$ atoms/cm$^3$.

The above three-layer structure is an example. For example, a two-layer structure without the semiconductor 661 or 663 may be employed. A four-layer structure in which any one of the semiconductors described as examples of the semiconductors 661 to 663 is provided below or over the semiconductor 661 or below or over the semiconductor 663 may be employed. An n-layer structure (n is an integer of five or more) in which any one of the semiconductors described as examples of the semiconductors 661 to 663 is provided at two or more of the following positions: over the semiconductor 661, below the semiconductor 661, over the semiconductor 663, and below the semiconductor 663.

<Structure Example 2 of Transistor>

Figure 11:
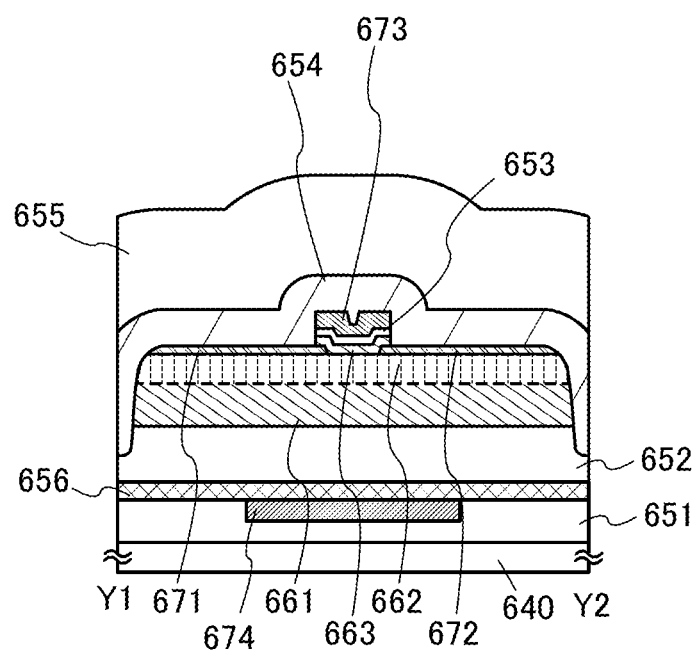
FIG. 11 is a cross-sectional view illustrating a transistor example.

In the transistor 600 in FIGS. 9A to 9D, the semiconductor 663 and the insulating film 653 may be etched at the same time when the conductive film 673 is formed by etching. FIG. 11 illustrates an example.

FIG. 11 illustrates the case where the semiconductor 663 and the insulating film 653 in FIG. 9B are provided only below the conductive film 673.

<Structure Example 3 of Transistor>

Figure 12:
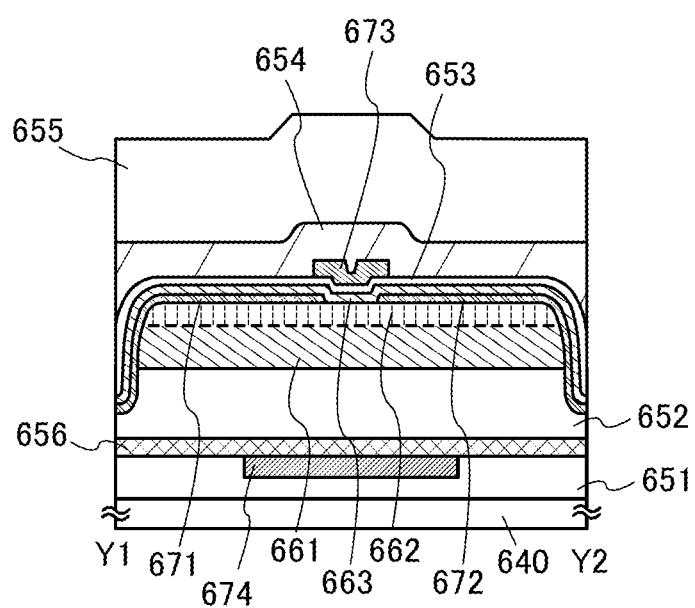
FIG. 12 is a cross-sectional view illustrating a transistor example.

In the transistor 600 in FIGS. 9A to 9D, the conductive films 671 and 672 may be in contact with side surfaces of the semiconductors 661 and 662. FIG. 12 illustrates an example.

FIG. 12 illustrates the case where the conductive films 671 and 672 in FIG. 9B are in contact with the side surfaces of the semiconductors 661 and 662.

<Structure Example 4 of Transistor>

Figure 13:
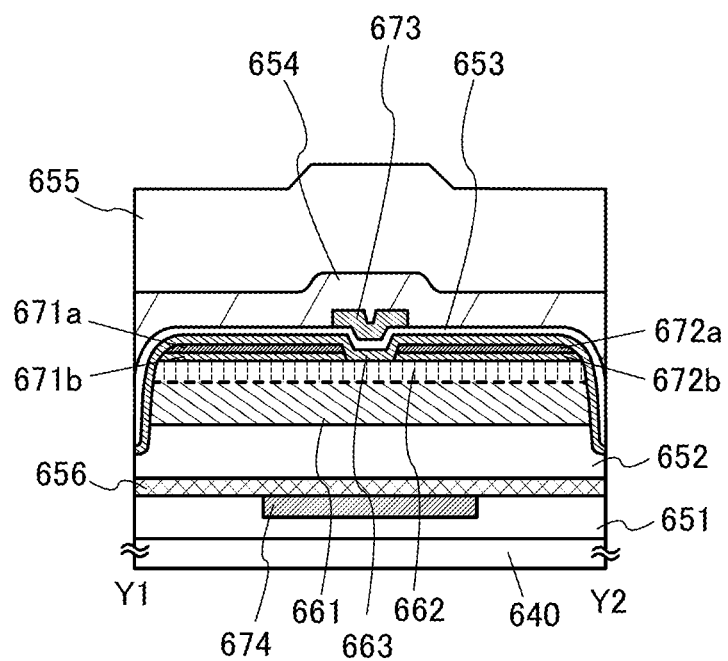
FIG. 13 is a cross-sectional view illustrating a transistor example.

In the transistor 600 in FIGS. 9A to 9D, the conductive film 671 may have a layered structure of conductive films 671*a* and 671*b*. In addition, the conductive film 672 may have a layered structure of conductive films 672*a* and 672*b*. FIG. 13 illustrates an example.

FIG. 13 illustrates the case where the conductive film 671 in FIG. 9B has a layered structure of the conductive films 671*a* and 671*b* and the conductive film 672 in FIG. 9B has a layered structure of the conductive films 672*a* and 672*b*.

The conductive films 671*b* and 672*b* may be formed using a transparent conductor, an oxide semiconductor, a nitride semiconductor, or an oxynitride semiconductor, for example. The conductive films 671*b* and 672*b* may be formed using, for example, a film containing indium, tin, and oxygen, a film containing indium and zinc, a film containing indium, tungsten, and zinc, a film containing tin and zinc, a film containing zinc and gallium, a film containing zinc and aluminum, a film containing zinc and fluorine, a film containing zinc and boron, a film containing tin and antimony, a film containing tin and fluorine, a film containing titanium and niobium, or the like. Alternatively, any of these layers may contain hydrogen, carbon, nitrogen, silicon, germanium, or argon.

The conductive films 671*b* and 672*b* may have a property of transmitting visible light. Alternatively, the conductive films 671*b* and 672*b* may have a property of not transmitting visible light, ultraviolet light, infrared light, or an X-ray by reflecting or absorbing it. In some cases, such a property can suppress a change in electrical characteristics of the transistor due to stray light.

The conductive films 671*b* and 672*b* may preferably be formed using a layer that does not form a Schottky barrier with the semiconductor 662 or the like. Accordingly, on-state characteristics of the transistor can be improved.

The conductive films 671*a* and 672*a* may have a single-layer structure or a layered structure of a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy film or a compound film may be used, for example, and a conductor containing aluminum, a conductor containing copper and titanium, a conductor containing copper and manganese, a conductor containing indium, tin, and oxygen, a conductor containing titanium and nitrogen, or the like may be used.

Note that the conductive films 671*b* and 672*b* preferably have higher resistance than the conductive films 671*a* and 672*a* according to circumstances. The conductive films 671*b* and 672*b* preferably have lower resistance than the channel of the transistor according to circumstances. For example, the conductive films 671*b* and 672*b* may have a resistivity of higher than or equal to 0.1 Ωcm and lower than or equal to 100 Ωcm, higher than or equal to 0.5 Ωcm and lower than or equal to 50 Ωcm, or higher than or equal to 1 Ωcm and lower than or equal to 10 Ωcm. The conductive films 671*b* and 672*b* having resistivity within the above range can reduce electric field concentration in a boundary portion between the channel and the drain. Therefore, a change in electrical characteristics of the transistor can be suppressed. In addition, punch-through current generated by an electric field from the drain can be reduced. Thus, a transistor with small channel length can have favorable saturation characteristics. Note that in a circuit configuration where the source and the drain do not interchange, only one of the conductive films 671*b* and 672*b* (e.g., the layer on the drain side) is preferably provided according to circumstances.

<Method for Manufacturing Transistor>

A method for manufacturing the transistor 600 in FIGS. 9A to 9D is described below with reference to FIGS. 14A to 14E and FIGS. 15A to 15D. Note that the left side of each of FIGS. 14A to 14E and FIGS. 15A to 15D is a cross-sectional view of the transistor in a channel length direction (a cross-sectional view taken along dashed-dotted line Y1-Y2 in FIG. 9A), and the right side of FIGS. 14A to 14E and FIGS. 15A to 15D is a cross-sectional view of the transistor in a channel width direction (a cross-sectional view taken along dashed-dotted line X1-X2 in FIG. 9A).

Figure 14A:
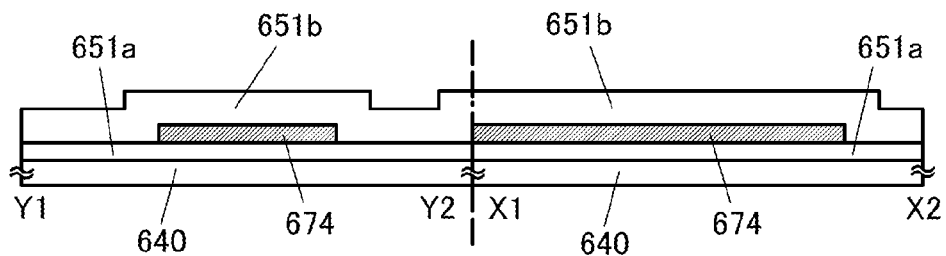
FIGS. 14A to 14E are cross-sectional views illustrating an example of a method for manufacturing a transistor.

First, an insulating film 651*a* is formed over the substrate 640 and the conductive film 674 is formed, and then, an insulating film 651*b* is formed (FIG. 14A).

As the substrate 640, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate can be used, for example. As the semiconductor substrate, a semiconductor substrate of silicon, germanium, or the like, or a compound semiconductor substrate of silicon carbide, silicon germanium, gallium arsenide, indium phosphide, zinc oxide, or gallium oxide can be used, for example. A semiconductor substrate in which an insulator region is provided in the above semiconductor substrate, e.g., a silicon on insulator (SOI) substrate can be used. As the conductor substrate, a graphite substrate, a metal substrate, an alloy substrate, a conductive resin substrate, or the like can be used. A substrate including a metal nitride, a substrate including a metal oxide, or the like can be used. An insulator substrate provided with a conductor or a semiconductor, a semiconductor substrate provided with a conductor or an insulator, a conductor substrate provided with a semiconductor or an insulator, or the like can be used. Alternatively, any of these substrates over which an element is provided may be used. As the element provided over the substrate, a capacitor, a resistor, a switching element, a light-emitting element, a memory element, or the like can be used.

A flexible substrate may be used as the substrate 640. As a method for providing a transistor over a flexible substrate, there is a method in which a transistor is formed over a non-flexible substrate, and then the transistor is separated and transferred to the substrate 640 that is a flexible substrate. In that case, a separation layer is preferably provided between the non-flexible substrate and the transistor. As the substrate 640, a sheet, a film, or foil containing a fiber may be used. The substrate 640 may have elasticity. The substrate 640 may have a property of returning to its original shape when bending or pulling is stopped. Alternatively, the substrate 640 may have a property of not returning to its original shape. The thickness of the substrate 640 is, for example, greater than or equal to 5 µm and less than or equal to 700 µm, preferably greater than or equal to 10 µm and less than or equal to 500 µm, more preferably greater than or equal to 15 µm and less than or equal to 300 µm. When the substrate 640 has small thickness, the weight of the semiconductor device can be reduced. When the substrate 640 has small thickness, even in the case of using glass or the like, the substrate 640 may have elasticity or a property of returning to its original shape when bending or pulling is stopped. Therefore, an impact applied to the semiconductor device over the substrate 640, which is caused by dropping or the like, can be reduced. That is, a durable semiconductor device can be provided.

For the flexible substrate 640, metal, an alloy, resin, glass, or fiber thereof can be used, for example. The flexible substrate 640 preferably has a lower coefficient of linear expansion because deformation due to an environment is suppressed. The flexible substrate 640 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used for the flexible substrate 640 because of its low coefficient of linear expansion.

A material containing silicon oxide, silicon nitride, silicon oxynitride, or silicon nitride oxide is preferably used as a material for the insulating films 651*a* and 651*b*. Alternatively, a metal oxide such as aluminum oxide, aluminum oxynitride, gallium oxide, gallium oxynitride, yttrium oxide, yttrium oxynitride, hafnium oxide, or hafnium oxynitride can be used. Note that in this specification, an oxynitride refers to a material that contains more oxygen than nitrogen, and a nitride oxide refers to a material that contains more nitrogen than oxygen.

The insulating films 651*a* and 651*b* may be formed using silicon oxide with high step coverage that is formed by reacting tetraethyl orthosilicate (TEOS), silane, or the like with oxygen, nitrous oxide, or the like.

The insulating films 651*a* and 651*b* may be formed by sputtering, chemical vapor deposition (CVD) (including thermal CVD, metal organic CVD (MOCVD), plasma-enhanced CVD (PECVD), and the like), molecular beam epitaxy (MBE), atomic layer deposition (ALD), pulsed laser deposition (PLD), or the like. In particular, it is preferable that the insulating films be formed by CVD, especially, plasma-enhanced CVD because coverage can be improved. It is preferable to use thermal CVD, MOCVD, or ALD in order to reduce plasma damage.

In the case where a semiconductor substrate is used as the substrate 640, the insulating film 651*a* may be a thermal oxidation film.

The conductive film 674 preferably has a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr); an alloy of such a low-resistance material; or a compound containing such a material as its main component. It is particularly preferable to use a high-melting-point material that has heat resistance and conductivity, such as tungsten or molybdenum. The conductive film 674 is preferably formed using a low-resistance conductive material such as aluminum or copper. The conductive film 674 is particularly preferably formed using a Cu—Mn alloy because manganese oxide formed at the interface with an insulator containing oxygen has a function of preventing Cu diffusion.

The conductive film 674 can be formed by, for example, sputtering, CVD (including thermal CVD, MOCVD, PECVD, and the like), MBE, ALD, or PLD.

Figure 14B:
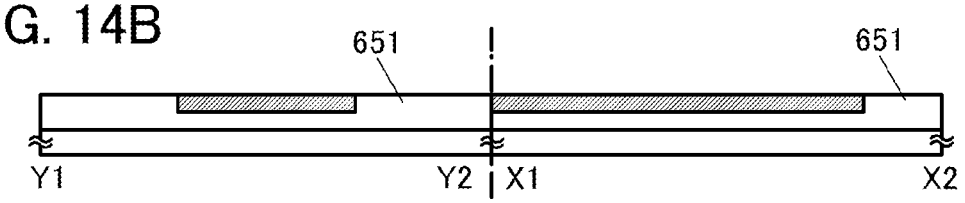

Next, a surface of the insulating film 651*b* is planarized by chemical mechanical polishing (CMP) (see FIG. 14B).

A planarization film may be used as the insulating film 651*b*. In that case, CMP or the like is not necessarily used for planarization. The planarization film can be formed by, for example, atmospheric pressure CVD, coating, or the like. An example of a film that can be formed by atmospheric pressure CVD is a film of borophosphosilicate glass (BPSG). Furthermore, an example of a film that can be formed by coating is a film of hydrogen silsesquioxane (HSQ).

Note that in the following description, the insulating films 651*a* and 651*b* are collectively referred to as an insulating film 651.

Figure 14C:
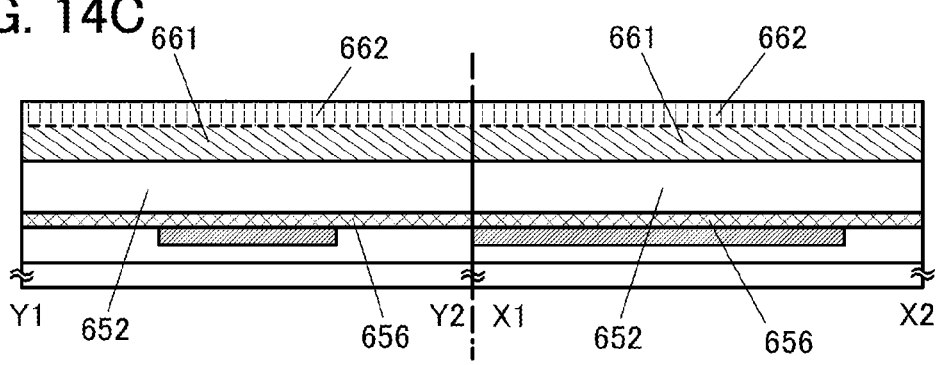
Figure 14D:
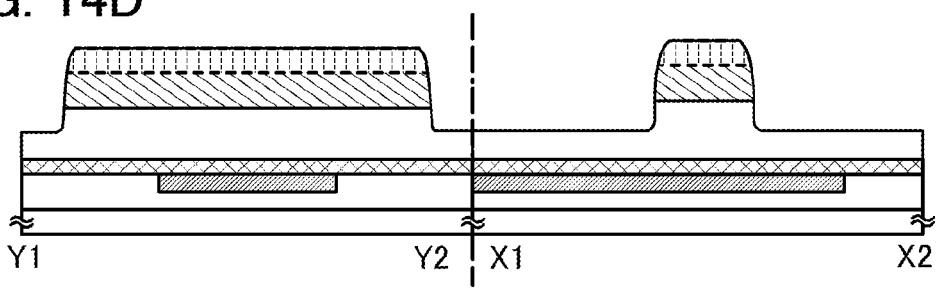
Figure 14E:
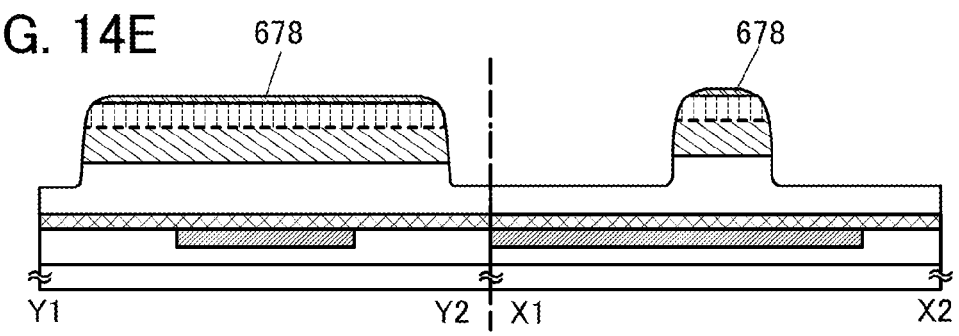

Next, the insulating films 652 and 656 and the semiconductors 661 and 662 are formed (see FIG. 14C).

The insulating films 652 and 656 may be formed by sputtering, CVD (including thermal CVD, MOCVD, PECVD, and the like), MBE, ALD, PLD, or the like.

Preferably, the insulating film 656 has a blocking effect against oxygen, hydrogen, water, alkali metal, alkaline earth metal, and the like. The insulating film 656 can be a nitride insulating film, for example. The nitride insulating film is formed using silicon nitride, silicon nitride oxide, aluminum nitride, aluminum nitride oxide, or the like. Note that an oxide insulating film may be provided instead of the nitride insulating film. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be used.

The insulating film 652 preferably contains an oxide that can supply oxygen to the semiconductor 660. For example, a material containing silicon oxide or silicon oxynitride is preferably used. Alternatively, a metal oxide such as aluminum oxide, aluminum oxynitride, gallium oxide, gallium oxynitride, yttrium oxide, yttrium oxynitride, hafnium oxide, or hafnium oxynitride can be used.

In order to make the insulating film 652 contain excess oxygen, the insulating film 652 may be deposited in an oxygen atmosphere, for example. Alternatively, a region containing excess oxygen may be formed by introducing oxygen into the insulating film 652 that has been formed. Both the methods may be combined.

For example, oxygen (including at least one of an oxygen radical, an oxygen atom, and an oxygen ion) is introduced into the insulating film 652 that has been formed, so that a region containing excess oxygen is formed. Oxygen can be introduced by ion implantation, ion doping, plasma immersion ion implantation, plasma treatment, or the like.

A gas containing oxygen can be used for oxygen introduction treatment. As the gas containing oxygen, oxygen, nitrous oxide, nitrogen dioxide, carbon dioxide, carbon monoxide, or the like can be used. Furthermore, a rare gas may be contained in the gas containing oxygen for the oxygen introduction treatment. Alternatively, hydrogen or the like may be contained. For example, a mixed gas of carbon dioxide, hydrogen, and argon may be used.

After the insulating film 652 is formed, the insulating film 652 may be subjected to planarization treatment using CMP or the like to improve the planarity of an upper surface of the insulating film 652.

The semiconductors 661 and 662 are preferably formed successively without exposure to the air. The semiconductors 661 and 662 may be formed by sputtering, CVD (including thermal CVD, MOCVD, PECVD, and the like), MBE, PLD, ALD, or the like.

The description of the semiconductors 661 and 662 in FIGS. 9A to 9D can be referred to for a material that can be used for the semiconductors 661 and 662.

Note that in the case where In—Ga—Zn oxide layers formed by MOCVD are used as the semiconductors 661 and 662, trimethylindium, trimethylgallium, dimethylzinc, and the like may be used as source gases. The source gas is not limited to the combination of these gases, and triethylindium or the like may be used instead of trimethylindium. Alternatively, triethylgallium or the like may be used instead of trimethylgallium. Alternatively, diethylzinc or the like may be used instead of dimethylzinc.

Here, after the semiconductor 661 is formed, oxygen may be introduced into the semiconductor 661. For example, oxygen (including at least one of an oxygen radical, an oxygen atom, and an oxygen ion) is introduced into the semiconductor 661 that has been formed, so that a region containing excess oxygen is formed. Oxygen can be introduced by ion implantation, ion doping, plasma immersion ion implantation, plasma treatment, or the like.

A gas containing oxygen can be used for oxygen introduction treatment. As the gas containing oxygen, oxygen, nitrous oxide, nitrogen dioxide, carbon dioxide, carbon monoxide, or the like can be used. Furthermore, a rare gas may be contained in the gas containing oxygen for the oxygen introduction treatment. Alternatively, hydrogen or the like may be contained. For example, a mixed gas of carbon dioxide, hydrogen, and argon may be used.

After the semiconductors 661 and 662 are formed, heat treatment is preferably performed. The heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the heat treatment may be performed in such a manner that heat treatment is performed in an inert gas atmosphere, and then another heat treatment is performed in an atmosphere containing an oxidizing gas at 10 ppm or more, in order to compensate released oxygen. The heat treatment may be performed immediately after formation of semiconductor films or may be performed after the semiconductor films are processed into the island-shaped semiconductors 661 and 662. Through the heat treatment, oxygen is supplied to the semiconductors from the insulating film 652 and the oxide film; thus, oxygen vacancies in the semiconductors can be reduced.

Then, a resist mask is formed, and an unnecessary portion is removed by etching. After that, the resist mask is removed. In this manner, a layered structure including the island-shaped semiconductors 661 and 662 can be formed (see FIG. 14D). Note that, in some cases, the insulating film 652 is partly etched when the semiconductor films are etched and the thickness of the insulating film 652 in a region that is not covered with the semiconductors 661 and 662 is reduced. For this reason, the insulating film 652 is preferably formed to have large thickness so as not to be removed by the etching.

Note that there is a possibility that the resist is totally removed depending on the etching conditions of the semiconductor films; therefore, what is called a hard mask formed using a material with high resistance to etching, such as an inorganic film or a metal film, may be used. Here, for example, a conductive film is used as a hard mask 678. An example is described in which the semiconductors 661 and 662 are formed in such a manner that the semiconductor films are processed using the hard mask 678 (see FIG. 14E).

The hard mask 678 preferably has a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr); an alloy of such a low-resistance material; or a compound containing such a material as its main component. It is particularly preferable to use a high-melting-point material that has heat resistance and conductivity, such as tungsten or molybdenum. The hard mask 678 is preferably formed using a low-resistance conductive material such as aluminum or copper. The hard mask 678 is particularly preferably formed using a Cu—Mn alloy because manganese oxide formed at the interface with an insulator containing oxygen has a function of preventing Cu diffusion.

The hard mask 678 is preferably formed using a conductive oxide including noble metal, such as iridium oxide, ruthenium oxide, or strontium ruthenate. Such a conductive oxide hardly takes oxygen from an oxide semiconductor even when it is in contact with the oxide semiconductor and hardly generates oxygen vacancies in the oxide semiconductor.

The hard mask 678 can be formed by, for example, sputtering, CVD (including thermal CVD, MOCVD, PECVD, and the like), MBE, ALD, or PLD.

Figure 15A:
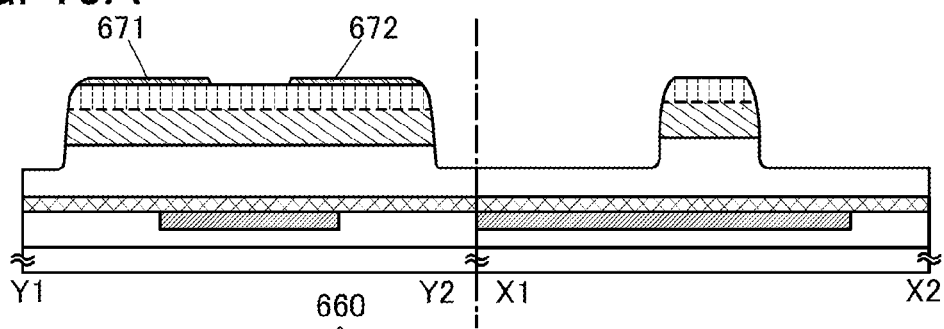
FIGS. 15A to 15D are cross-sectional views illustrating the example of the method for manufacturing the transistor.
Figure 15B:
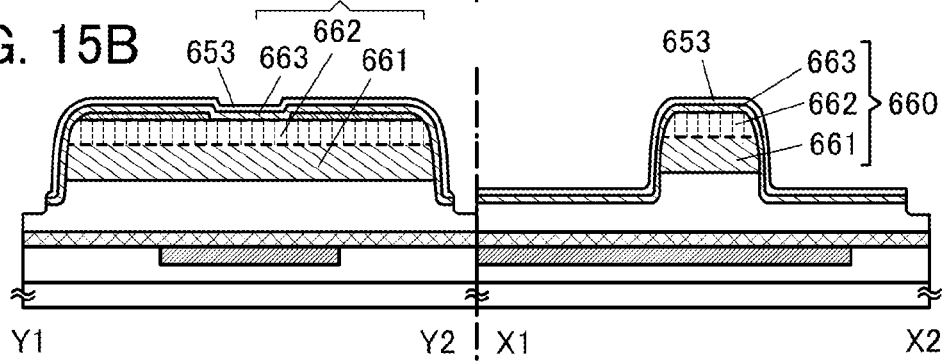

Next, a resist mask is formed, and the hard mask 678 is processed into the conductive films 671 and 672 by etching (see FIG. 15A). Here, in some cases, upper portions of the semiconductor 662 and the insulating film 652 are partly etched when the hard mask 678 is etched and a portion that does not overlap with the conductive film 671 or 672 is thinned. For this reason, the semiconductor 662 is preferably formed to have large thickness in advance in consideration of etching depth.

Then, the semiconductor 663 and the insulating film 653 are formed. After that, a resist mask is formed, the semiconductor 663 and the insulating film 653 are processed by etching, and the resist mask is removed (see FIG. 15B).

Figure 15C:
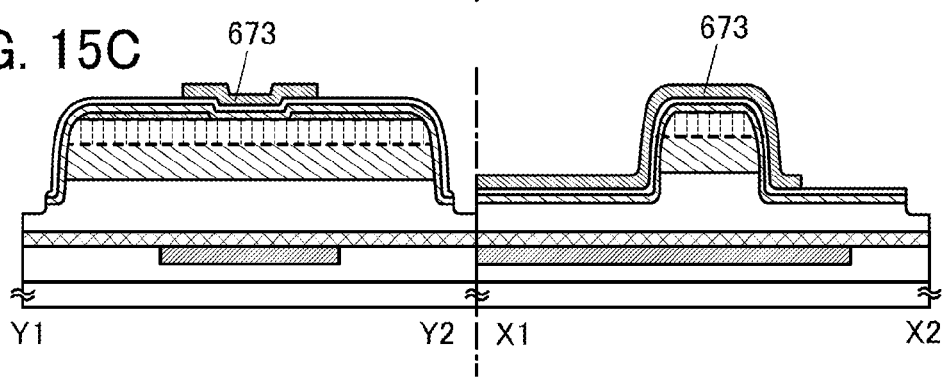
Figure 15D:
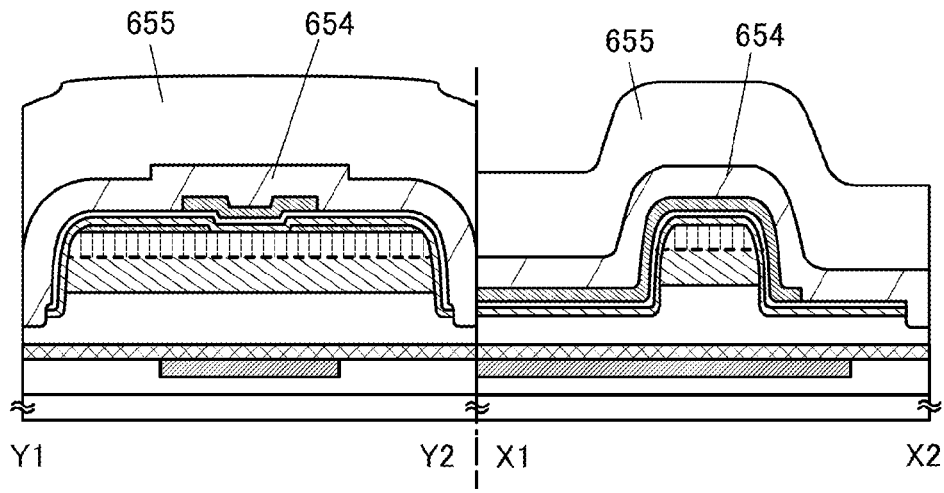

Next, the conductive film 673 is formed, a resist mask is formed, the conductive film 673 is processed by etching, and the resist mask is removed, so that a gate electrode is formed (see FIG. 15C).

The semiconductor 663, the insulating film 653, and the conductive film 673 may be formed by sputtering, CVD (including thermal CVD, MOCVD, PECVD, and the like), MBE, PLD, ALD, or the like. In particular, it is preferable that the semiconductor 663, the insulating film 653, and the conductive film 673 be formed by CVD, especially, plasma-enhanced CVD because coverage can be improved. It is preferable to use thermal CVD, MOCVD, or ALD in order to reduce plasma damage.

The semiconductor 663 and the insulating film 653 may be etched after the conductive film 673 is formed. Etching may be performed with a resist mask, for example. Alternatively, the insulating film 653 and the semiconductor 663 may be etched using the conductive film 673 as a mask.

After the semiconductor 663 is formed, oxygen may be introduced into the semiconductor 663. For example, oxygen (including at least one of an oxygen radical, an oxygen atom, and an oxygen ion) is introduced into the semiconductor 663 that has been formed, so that a region containing excess oxygen is formed. Oxygen can be introduced by ion implantation, ion doping, plasma immersion ion implantation, plasma treatment, or the like.

A gas containing oxygen can be used for oxygen introduction treatment. As the gas containing oxygen, oxygen, nitrous oxide, nitrogen dioxide, carbon dioxide, carbon monoxide, or the like can be used. Furthermore, a rare gas may be contained in the gas containing oxygen for the oxygen introduction treatment. Alternatively, hydrogen or the like may be contained. For example, a mixed gas of carbon dioxide, hydrogen, and argon may be used.

The description of the semiconductor 663 in FIGS. 9A to 9D may be referred to for a material that can be used for the semiconductor 663.

The insulating film 653 can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating film 653 may be a stack of any of the above materials. Note that the insulating film 653 may contain lanthanum (La), nitrogen, zirconium (Zr), or the like as an impurity.

An example of a layered structure of the insulating film 653 is described. The insulating film 653 contains oxygen, nitrogen, silicon, or hafnium, for example. Specifically, the insulating film 653 preferably contains hafnium oxide and one of silicon oxide and silicon oxynitride.

Hafnium oxide has a higher dielectric constant than silicon oxide and silicon oxynitride. Therefore, by using hafnium oxide, the thickness can be larger than silicon oxide; thus, leakage current due to tunneling current can be low. That is, it is possible to provide a transistor with low off-state current. That is, it is possible to provide a transistor with low off-state current.

Next, the insulating film 654 is formed. The insulating film 654 has a function of blocking oxygen, hydrogen, water, alkali metal, alkaline earth metal, and the like. The insulating film 654 can be formed by sputtering, CVD (including thermal CVD, MOCVD, PECVD, and the like), MBE, ALD, PLD, or the like, for example. In particular, it is preferable that the insulating film 654 be formed by CVD, especially, plasma-enhanced CVD because coverage can be favorable. It is preferable to use thermal CVD, MOCVD, or ALD in order to reduce plasma damage.

The insulating film 654 preferably has a function of blocking oxygen, hydrogen, water, alkali metal, alkaline earth metal, and the like. The insulating film 654 can be a nitride insulating film, for example. Examples of the nitride insulating film include a silicon nitride film, a silicon nitride oxide film, an aluminum nitride film, and an aluminum nitride oxide film. Note that instead of the nitride insulating film, an oxide insulating film having a blocking effect against oxygen, hydrogen, water, and the like may be provided. Examples of the oxide insulating film include an aluminum oxide film, an aluminum oxynitride film, a gallium oxide film, a gallium oxynitride film, an yttrium oxide film, an yttrium oxynitride film, a hafnium oxide film, and a hafnium oxynitride film.

An aluminum oxide film is preferably used as the insulating film 654 because it is highly effective in preventing transmission of both oxygen and impurities such as hydrogen and moisture. Furthermore, oxygen contained in the aluminum oxide film can be diffused into the semiconductor 660.

After the insulating film 654 is formed, heat treatment is preferably performed. Through the heat treatment, oxygen can be supplied from the insulating film 652 and the like to the semiconductor 660 to reduce oxygen vacancy in the semiconductor 660. At this time, oxygen released from the insulating film 652 is blocked by the insulating films 654 and 656; therefore, oxygen can be effectively confined. Thus, the amount of oxygen supplied to the semiconductor 660 can be increased, so that oxygen vacancy in the semiconductor 660 can be effectively reduced.

Next, the insulating film 655 is formed. The insulating film 655 can be formed by sputtering, CVD (including thermal CVD, MOCVD, PECVD, and the like), MBE, ALD, PLD, or the like, for example. In particular, it is preferable that the insulating film 655 be formed by CVD, especially, plasma-enhanced CVD because coverage can be favorable. It is preferable to use thermal CVD, MOCVD, or ALD in order to reduce plasma damage. In the case where the insulating film 655 is formed using an organic insulating material such as an organic resin, coating such as spin coating may be used. After the insulating film 655 is formed, an upper surface thereof is preferably subjected to planarization treatment.

The insulating film 655 can be formed using an insulator containing one or more materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like. Alternatively, the insulating film 655 can be formed using an organic resin such as a polyimide resin, a polyamide resin, an acrylic resin, a siloxane resin, an epoxy resin, or a phenol resin. The insulating film 655 may be a stack of any of the above materials.

The structures, the methods, and the like described in this embodiment can be combined with any of the structures, the methods, and the like described in the other embodiments as appropriate.

Embodiment 4

In this embodiment, a CPU in which the transistor described in Embodiment 1 can be used and the storage device described in Embodiment 2 is included is described.

FIG. 16 is a block diagram illustrating a structure example of a CPU at least partly including any of the transistors described in the above embodiments.

The CPU in FIG. 16 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 16 is just an example in which the structure is simplified, and an actual CPU may have a variety of structures depending on the application. For example, the CPU may have the following configuration: a structure including the CPU in FIG. 16 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal on the basis of a reference clock signal, and supplies the internal clock signal to the above circuits.

In the CPU in FIG. 16, a memory cell is provided in the register 1196. As the memory cell of the register 1196, the transistor described in Embodiment 1 or the storage device described in Embodiment 2 can be used.

In the CPU in FIG. 16, the register controller 1197 selects operation of retaining data in the register 1196 in accordance with an instruction from the ALU 1191. That is, the register controller 1197 selects whether data is retained by a flip-flop or a capacitor in the memory cell included in the register 1196. When data retention by the flip-flop is selected, power supply voltage is supplied to the memory cell in the register 1196. When data retention by the capacitor is selected, the data is rewritten in the capacitor, and supply of power supply voltage to the memory cell in the register 1196 can be stopped.

The structures, the methods, and the like described in this embodiment can be combined with any of the structures, the methods, and the like described in the other embodiments as appropriate.

Embodiment 5

A semiconductor device in one embodiment of the present invention can be used for display devices, personal computers, or image reproducing devices provided with recording media (typically, devices that reproduce the content of recording media such as digital versatile discs (DVDs) and have displays for displaying the reproduced images). Furthermore, as electronic devices that can include the semiconductor device in one embodiment of the present invention, cellular phones, game machines (including portable game machines), portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATMs), vending machines, and the like can be given. FIGS. 17A to 17F illustrate specific examples of these electronic devices.

Figure 17A:
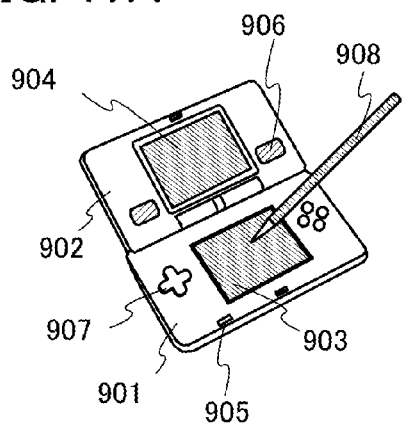
FIGS. 17A to 17F are perspective views each illustrating an electronic device example.

FIG. 17A illustrates a portable game machine, which includes housings 901 and 902, display portions 903 and 904, a microphone 905, speakers 906, an operation key 907, a stylus 908, and the like. Although the portable game machine in FIG. 17A has the two display portions 903 and 904, the number of display portions included in the portable game machine is not limited to this.

Figure 17B:
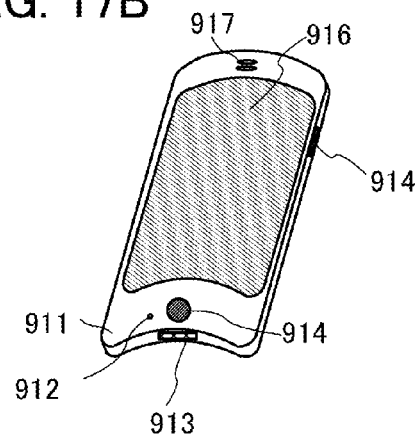

FIG. 17B illustrates a cellular phone, which includes a housing 911, a display portion 916, operation buttons 914, an external connection port 913, a speaker 917, a microphone 912, and the like. When the display portion 916 is touched with a finger or the like, data can be input into the cellular phone in FIG. 17B. Furthermore, operations such as making a call and inputting a letter can be performed by touch on the display portion 916 with a finger or the like. With the operation buttons 914, power ON/OFF can be switched. In addition, types of images displayed on the display portion 916 can be switched; for example, switching images from a mail creation screen to a main menu screen.

Figure 17C:
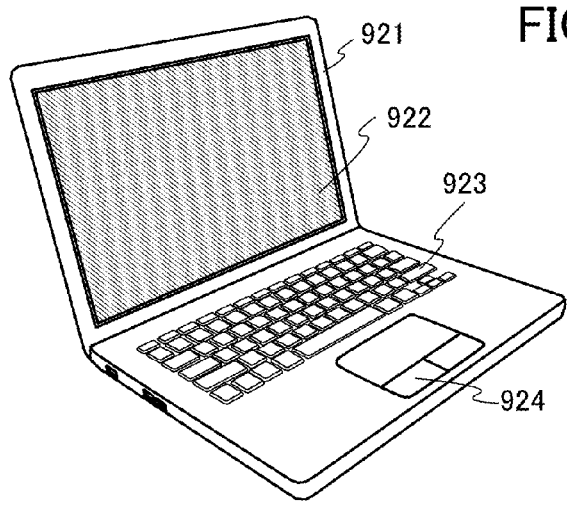

FIG. 17C illustrates a laptop, which includes a housing 921, a display portion 922, a keyboard 923, a pointing device 924, and the like.

Figure 17D:
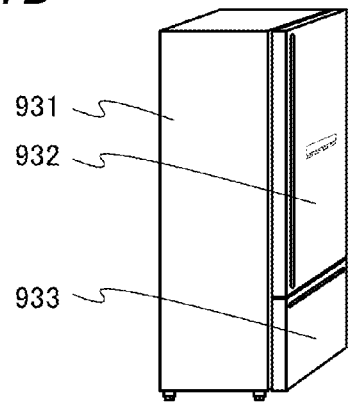

FIG. 17D illustrates an electric refrigerator-freezer, which includes a housing 931, a refrigerator door 932, a freezer door 933, and the like.

Figure 17E:
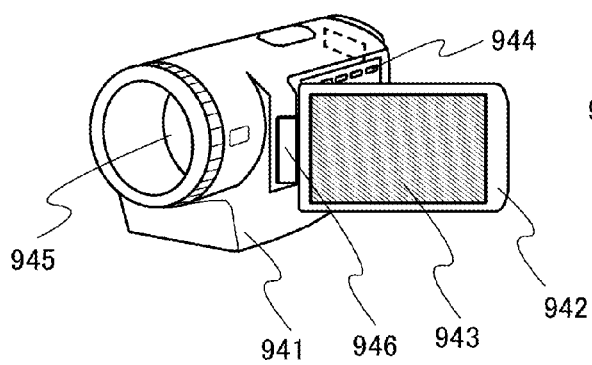

FIG. 17E illustrates a video camera, which includes a first housing 941, a second housing 942, a display portion 943, operation keys 944, a lens 945, a joint 946, and the like. The operation keys 944 and the lens 945 are provided in the first housing 941, and the display portion 943 is provided in the second housing 942. The first housing 941 and the second housing 942 are connected to each other with the joint 946, and an angle between the first housing 941 and the second housing 942 can be changed with the joint 946. An image displayed on the display portion 943 may be switched in accordance with the angle between the first housing 941 and the second housing 942 at the joint 946.

Figure 17F:
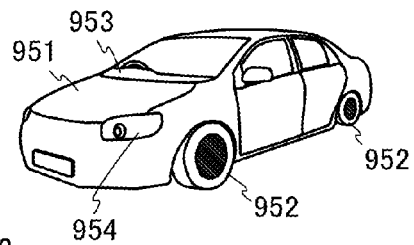
Figure 18A:
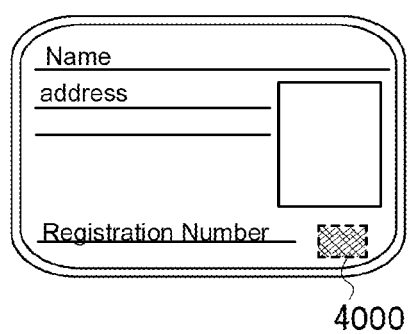
FIGS. 18A to 18F are perspective views each illustrating a usage example of an RFID tag.
Figure 18B:
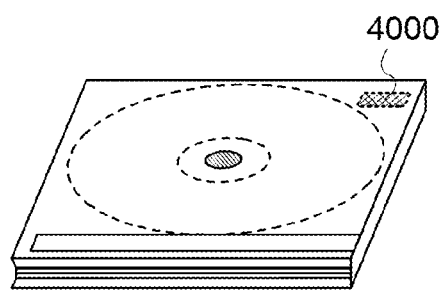
Figure 18C:
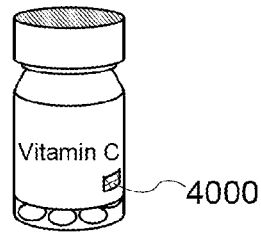
Figure 18D:
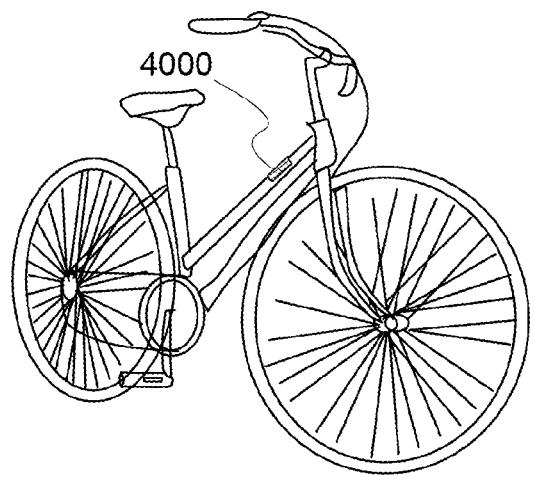
Figure 18E:
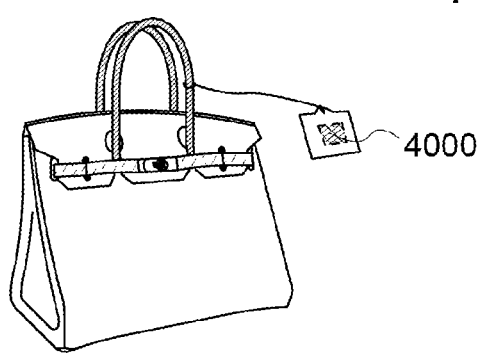
Figure 18F:
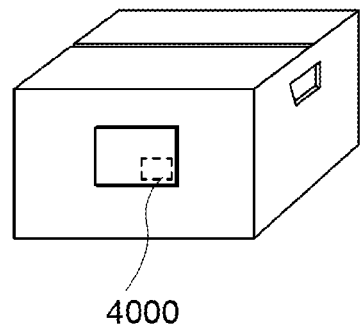

FIG. 17F illustrates an ordinary vehicle, which includes a car body 951, wheels 952, a dashboard 953, lights 954, and the like.

Note that this embodiment can be combined with any of the other embodiments in this specification as appropriate.

Embodiment 6

In this embodiment, application examples of an RF tag that can include a semiconductor device in one embodiment of the present invention are described with reference to FIGS. 18A to 18F. The RF tag is widely used and can be provided for, for example, products such as bills, coins, securities, bearer bonds, documents (e.g., driver's licenses or resident's cards, see FIG. 18A), recording media (e.g., DVDs or video tapes, see FIG. 18B), packaging containers (e.g., wrapping paper or bottles, see FIG. 18C), vehicles (e.g., bicycles, see FIG. 18D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 18E and 18F).

An RF tag 4000 in one embodiment of the present invention is fixed to products by being attached to a surface thereof or embedded therein. For example, the RF tag 4000 is fixed to each product by being embedded in paper of a book, or embedded in an organic resin of a package. Since the RF tag 4000 in one embodiment of the present invention can be reduced in size, thickness, and weight, the RF tag 4000 can be fixed to a product without spoiling the design of the product. Furthermore, bills, coins, securities, bearer bonds, documents, or the like can have an identification function by being provided with the RF tag 4000 in one embodiment of the present invention, and the identification function can be utilized to prevent counterfeiting. Moreover, the efficiency of a system such as an inspection system can be improved by providing the RF tag in one embodiment of the present invention for packaging containers, recording media, personal belongings, foods, clothing, household goods, electronic devices, or the like. Vehicles can also have higher security against theft or the like by being provided with the RF tag in one embodiment of the present invention.

As described above, by using the RF tag in one embodiment of the present invention for each application described in this embodiment, power for operation such as data writing or data reading can be reduced, which results in an increase in the maximum communication distance. Moreover, data can be retained for an extremely long period even in a state where power is not supplied; thus, the RF tag in one embodiment of the present invention can be favorably used for application in which data is not frequently written or read.

Next, an application example of a display device that can include the semiconductor device in one embodiment of the present invention is described. In one example, a display device includes a pixel. The pixel includes a transistor and a display element, for example. Alternatively, the display device includes a driver circuit for driving the pixel. The driver circuit includes a transistor, for example. As these transistors, any of the transistors described in the other embodiments can be used, for example.

For example, in this specification and the like, a display element, a display device that is a device including a display element, a light-emitting element, and a light-emitting device that is a device including a light-emitting element can employ a variety of modes or can include a variety of elements. A display element, a display device, a light-emitting element, or a light-emitting device includes, for example, at least one of an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, and a display element including a carbon nanotube. Other than the above, display media whose contrast, luminance, reflectivity, transmittance, or the like is changed by electrical or magnetic effect may be included. Examples of display devices including EL elements include an EL display. Examples of display devices including electron emitters include a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, electronic liquid powder (registered trademark), or electrophoretic elements include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a storage circuit such as an SRAM can be provided below the reflective electrodes, which leads to lower power consumption. Note that in the case where an LED is used, graphene or graphite may be provided below an LED electrode or a nitride semiconductor. Graphene or graphite may be a multi-layer film formed by overlap of a plurality of layers. When graphene or graphite is provided in this manner, a nitride semiconductor, for example, an n-type GaN semiconductor layer including crystals can be easily formed thereover. The LED can be formed by providing, for example, a p-type GaN semiconductor layer including crystals thereover. An AlN layer may be provided between graphene or graphite and the n-type GaN semiconductor layer including crystals. The GaN semiconductor layer included in the LED may be formed by MOCVD. Note that when graphene is provided, the GaN semiconductor layer included in the LED can be formed by sputtering.

Note that this embodiment can be combined with any of the other embodiments in this specification as appropriate.

Embodiment 7

In this embodiment, the crystal structure of an oxide semiconductor applicable to an oxide semiconductor transistor described in this specification is described.

In this specification, the term "parallel" indicates that an angle formed between two straight lines is greater than or equal to −10° and less than or equal to 10°, and accordingly includes the case where the angle is greater than or equal to −5° and less than or equal to 5°. The term "substantially parallel" indicates that an angle formed between two straight lines is greater than or equal to −30° and less than or equal to 30°. In addition, the term "perpendicular" indicates that an angle formed between two straight lines is greater than or equal to 80° and less than or equal to 100°, and accordingly includes the case where the angle is greater than or equal to 85° and less than or equal to 95°. The term "substantially perpendicular" indicates that an angle formed between two straight lines is greater than or equal to 60° and less than or equal to 120°.

In this specification, trigonal and rhombohedral crystal systems are included in a hexagonal crystal system.

An oxide semiconductor film is classified into a non-single-crystal oxide semiconductor film and a single crystal oxide semiconductor film. Alternatively, an oxide semiconductor is classified into, for example, a crystalline oxide semiconductor and an amorphous oxide semiconductor.

Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. In addition, examples of a crystalline oxide semiconductor include a single crystal oxide semiconductor, a CAAC-OS, a polycrystalline oxide semiconductor, and a microcrystalline oxide semiconductor.

First, a CAAC-OS film is described.

The CAAC-OS film is one of oxide semiconductor films having a plurality of c-axis aligned crystal parts.

With a transmission electron microscope (TEM), a combined analysis image (also referred to as a high-resolution TEM image) of a bright-field image and a diffraction pattern of the CAAC-OS film is observed. Consequently, a plurality of crystal parts are observed clearly. However, in the high-resolution TEM image, a boundary between crystal parts, i.e., a grain boundary is not observed clearly. Thus, in the CAAC-OS film, a reduction in electron mobility due to the grain boundary is less likely to occur.

According to the high-resolution cross-sectional TEM image of the CAAC-OS film observed in a direction substantially parallel to a sample surface (cross-sectional TEM image), metal atoms are arranged in a layered manner in the crystal parts. Each metal atom layer has a morphology that reflects a surface over which the CAAC-OS film is formed (also referred to as a formation surface) or a top surface of the CAAC-OS film, and is provided parallel to the formation surface or the top surface of the CAAC-OS film.

On the other hand, according to the high-resolution planar TEM image of the CAAC-OS film observed in a direction substantially perpendicular to the sample surface (planar TEM image), metal atoms are arranged in a triangular or hexagonal configuration in the crystal parts. However, there is no regularity of arrangement of metal atoms between different crystal parts.

The CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic order of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic order of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as "highly purified intrinsic" or "substantially highly purified intrinsic." A highly purified intrinsic or substantially highly purified intrinsic oxide semiconductor film has few carrier generation sources, and thus can have low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has few variations in electrical characteristics and high reliability. Charge trapped by the carrier traps in the oxide semiconductor film takes a long time to be released and may behave like fixed charge. Thus, the transistor that includes the oxide semiconductor film having high impurity concentration and high density of defect states has unstable electrical characteristics in some cases.

In a transistor including the CAAC-OS film, changes in electrical characteristics of the transistor due to irradiation with visible light or ultraviolet light are small.

Next, a microcrystalline oxide semiconductor film is described.

A microcrystalline oxide semiconductor film has a region where a crystal part is observed in a high-resolution TEM image and a region where a crystal part is not clearly observed in a high-resolution TEM image. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as a nanocrystalline oxide semiconductor (nc-OS) film. In a high-resolution TEM image, a grain boundary cannot be found clearly in the nc-OS film in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has periodic atomic order. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak that shows a crystal plane does not appear. Furthermore, a halo pattern is shown in a selected-area electron diffraction pattern of the nc-OS film obtained by using an electron beam having a probe diameter larger than the diameter of a crystal part (e.g., larger than or equal to 50 nm). Meanwhile, spots are shown in a nanobeam electron diffraction pattern of the nc-OS film obtained by using an electron beam having a probe diameter close to or smaller than the diameter of a crystal part. Furthermore, in a nanobeam electron diffraction pattern of the nc-OS film, regions with high luminance in a circular (ring) pattern are observed in some cases. Also in a nanobeam electron diffraction pattern of the nc-OS film, a plurality of spots are shown in a ring-like region in some cases.

The nc-OS film is an oxide semiconductor film that has high regularity than an amorphous oxide semiconductor film. Thus, the nc-OS film has a lower density of defect states than the amorphous oxide semiconductor film. Note that there is no regularity of crystal orientation between different crystal parts in the nc-OS film; thus, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state as in quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Furthermore, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be seen. Furthermore, in the high-resolution TEM image, there are a region where a crystal part is clearly observed and a region where a crystal part is not observed. In the a-like OS film, crystallization by a slight amount of electron beam used for TEM observation occurs and growth of the crystal part is found sometimes. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an InGaZnO$_4$ crystal has a layered structure in which two Ga—Zn—O layers are included between In—O layers. A unit cell of the InGaZnO$_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as a d value). The value is calculated to be 0.29 nm from crystal structure analysis. Thus, each of the lattice fringes in which the spacing therebetween is from 0.28 nm to 0.30 nm corresponds to the a-b plane of the InGaZnO$_4$ crystal, focusing on the lattice fringes in the high-resolution TEM image.

The density of an oxide semiconductor film might vary depending on its structure. For example, if the composition of an oxide semiconductor film is determined, the structure of the oxide semiconductor film can be estimated from a comparison between the density of the oxide semiconductor film and the density of a single-crystal oxide semiconductor film having the same composition as the oxide semiconductor film. For example, the density of an a-like OS film is higher than or equal to 78.6% and lower than 92.3% of that of the single-crystal oxide semiconductor film. In addition, for example, the density of an nc-OS film or a CAAC-OS film is higher than or equal to 92.3% and lower than 100% of that of the single-crystal oxide semiconductor film. Note that it is difficult to form an oxide semiconductor film whose density is lower than 78% of that of the single-crystal oxide semiconductor film.

Specific examples of the above are described. For example, in the case of an oxide semiconductor film with an atomic ratio of In:Ga:Zn=1:1:1, the density of single-crystal InGaZnO$_4$ with a rhombohedral crystal structure is 6.357 g/cm$^3$. Thus, for example, in the case of the oxide semiconductor film with an atomic ratio of In:Ga:Zn=1:1:1, the density of an a-like OS film is higher than or equal to 5.0 g/cm$^3$ and lower than 5.9 g/cm$^3$. In addition, for example, in the case of the oxide semiconductor film with an atomic ratio of In:Ga:Zn=1:1:1, the density of an nc-OS film or a CAAC-OS film is higher than or equal to 5.9 g/cm$^3$ and lower than 6.3 g/cm$^3$.

Note that single crystals with the same composition do not exist in some cases. In such a case, by combining single crystals with different compositions at a given proportion, it is possible to calculate density that corresponds to the density of a single crystal with a desired composition. The density of the single crystal with a desired composition may be calculated using weighted average with respect to the combination ratio of the single crystals with different compositions. Note that it is preferable to combine as few kinds of single crystals as possible for density calculation.

Note that an oxide semiconductor film may be a stacked film including two or more films of an amorphous oxide semiconductor film, an a-like OS film, a microcrystalline oxide semiconductor film, and a CAAC-OS film, for example.

Note that this embodiment can be combined with any of the other embodiments in this specification as appropriate.

This application is based on Japanese Patent Application serial No. 2014-151823 filed with Japan Patent Office on Jul. 25, 2014, the entire contents of which are hereby incorporated by reference.

What is claimed is:

1. A semiconductor device comprising:
a first transistor;
a second transistor;
a third transistor;
a fourth transistor including a first gate and a second gate;
a capacitor; and
an input terminal,
wherein a gate of the first transistor is electrically connected to a third node,
wherein one of a source and a drain of the first transistor is electrically connected to the input terminal,
wherein the other of the source and the drain of the first transistor is electrically connected to a first node,
wherein a gate of the second transistor is electrically connected to a second node, wherein one of a source and a drain of the second transistor is electrically connected to the first node, wherein the other of the source and the drain of the second transistor is electrically connected to the second node, wherein a gate of the third transistor is electrically connected to the third node, wherein one of a source and a drain of the third transistor is electrically connected to the second node, wherein the other of the source and the drain of the third transistor is electrically connected to the third node, wherein a first terminal of the capacitor is electrically connected to the third node, wherein the second gate is electrically connected to the third node, and wherein the first gate and the second gate overlap with each other with a semiconductor layer therebetween.

2. The semiconductor device according to claim 1,
wherein the first transistor further includes a third gate,
wherein the third transistor further includes a fourth gate,
wherein the second transistor further includes a fifth gate, and
wherein the third gate, the fourth gate, and the fifth gate are electrically connected to the third node.

3. The semiconductor device according to claim 1, wherein each of the first to third transistors is an n-channel transistor.

4. The semiconductor device according to claim 1, wherein each of the first to third transistors includes an oxide semiconductor in a channel.

5. The semiconductor device according to claim 4, wherein the oxide semiconductor contains indium, zinc, and M, where M is Al, Ti, Ga, Y, Zr, La, Ce, Nd, or Hf.

6. A storage device comprising the semiconductor device according to claim 1 and a storage element.

7. A register circuit comprising the semiconductor device according to claim 1.

8. A display device comprising the semiconductor device according to claim 1 and a display element.

9. An electronic device comprising the semiconductor device according to claim 1 and at least one of a microphone, a speaker, a display portion, and an operation key.

10. A semiconductor device comprising:
a first transistor including a first gate and a second gate;
a second transistor including a third gate and a fourth gate;
a third transistor including a fifth gate and a sixth gate;
a capacitor;
an input terminal; and
a memory cell comprising a fourth transistor including a seventh gate and a eighth gate,
wherein one of a source and a drain of the first transistor is electrically connected to the input terminal,
wherein the other of the source and the drain of the first transistor is electrically connected to one of a source and a drain of the second transistor,
wherein one of a source and a drain of the third transistor is electrically connected to the third gate and the other of the source and the drain of the second transistor, and
wherein the first gate, the second gate, the fourth gate, the fifth gate, the sixth gate, the seventh gate, the other of the source and the drain of the third transistor, and a first terminal of the capacitor are electrically connected to each other.

11. The semiconductor device according to claim 10, wherein each of the first to third transistors is an n-channel transistor.

12. The semiconductor device according to claim 10, wherein each of the first to third transistors includes an oxide semiconductor in a channel.

13. The semiconductor device according to claim 12, wherein the oxide semiconductor contains indium, zinc, and M, where M is Al, Ti, Ga, Y, Zr, La, Ce, Nd, or Hf.

14. A storage device comprising the semiconductor device according to claim 10 and a storage element.

15. A register circuit comprising the semiconductor device according to claim 10.

16. A display device comprising the semiconductor device according to claim 10 and a display element.

17. An electronic device comprising the semiconductor device according to claim 10, and at least one of a microphone, a speaker, a display portion, and an operation key.

* * * * *